(12) United States Patent
Ota et al.

(10) Patent No.: US 12,119,334 B2
(45) Date of Patent: Oct. 15, 2024

(54) PHOTOELECTRIC CONVERSION APPARATUS, PHOTO-DETECTION SYSTEM, AND MOVABLE BODY

(71) Applicant: CANON KABUSHIKI KAISHA, Tokyo (JP)

(72) Inventors: Yasuharu Ota, Tokyo (JP); Yukihiro Kuroda, Tokyo (JP); Kazuhiro Morimoto, Kanagawa (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 608 days.

(21) Appl. No.: 17/498,528

(22) Filed: Oct. 11, 2021

(65) Prior Publication Data

US 2022/0115366 A1 Apr. 14, 2022

(30) Foreign Application Priority Data

Oct. 14, 2020 (JP) .................................. 2020-173388
Sep. 27, 2021 (JP) .................................. 2021-156344

(51) Int. Cl.
| | |
|---|---|
| *H01L 27/144* | (2006.01) |
| *B60W 30/09* | (2012.01) |
| *G01C 3/02* | (2006.01) |
| *G01J 1/44* | (2006.01) |
| *G01K 1/02* | (2021.01) |
| *G05D 1/00* | (2006.01) |
| *H01L 25/18* | (2023.01) |

(Continued)

(52) U.S. Cl.
CPC ............ *H01L 25/18* (2013.01); *B60W 30/09* (2013.01); *G01C 3/02* (2013.01); *G01J 1/44* (2013.01); *G01K 1/026* (2013.01); *G05D 1/0212* (2013.01); *G05D 1/0231* (2013.01); *H01L 27/1443* (2013.01); *H01L 27/14634* (2013.01); *B60T 7/22* (2013.01); *B60T 2201/022* (2013.01); *B60T 2210/32* (2013.01); *G01J 2001/444* (2013.01); *G01J 2001/4466* (2013.01)

(58) Field of Classification Search
None
See application file for complete search history.

(56) References Cited

U.S. PATENT DOCUMENTS

| | | | |
|---|---|---|---|
| 7,709,869 | B2 | 5/2010 | Kuroda |
| 7,911,521 | B2 | 3/2011 | Kuroda et al. |
| 7,935,995 | B2 | 5/2011 | Watanabe et al. |

(Continued)

FOREIGN PATENT DOCUMENTS

| | | |
|---|---|---|
| JP | H11-211563 A | 8/1999 |
| JP | 3785035 B2 | 6/2006 |
| JP | 2020-174149 A | 10/2020 |

*Primary Examiner* — Jack S Chen
(74) *Attorney, Agent, or Firm* — Venable LLP

(57) ABSTRACT

A photoelectric conversion apparatus includes: a first substrate including an avalanche photodiode; and a second substrate, in which the first substrate and the second substrate are stacked on each other, and further includes: a temperature detection unit arranged in at least one of the first substrate and the second substrate and having an output characteristic depending on a temperature; and a temperature value generating circuit arranged outside the first substrate and configured to convert output from the temperature detection unit into a temperature value signal that is a signal indicating temperature information.

29 Claims, 15 Drawing Sheets

(51) Int. Cl.
*H01L 27/146* (2006.01)
*B60T 7/22* (2006.01)

(56) References Cited

U.S. PATENT DOCUMENTS

| | | |
|---|---|---|
| 8,174,599 B2 | 5/2012 | Kuroda |
| 8,222,682 B2 | 7/2012 | Watanabe et al. |
| 8,223,238 B2 | 7/2012 | Kuroda et al. |
| 8,345,137 B2 | 1/2013 | Shinohara et al. |
| 8,390,713 B2 | 3/2013 | Kuroda et al. |
| 8,670,058 B2 | 3/2014 | Hayashi et al. |
| 8,710,558 B2 | 4/2014 | Inoue et al. |
| 8,994,862 B2 | 3/2015 | Kuroda et al. |
| 9,236,406 B2 | 1/2016 | Kuroda |
| 9,305,954 B2 | 4/2016 | Kato et al. |
| 9,357,122 B2 | 5/2016 | Kususaki et al. |
| 9,445,023 B2 | 9/2016 | Kuroda et al. |
| 9,762,837 B2 | 9/2017 | Kuroda et al. |
| 9,978,885 B1 | 5/2018 | Kuznetsov |
| 10,021,316 B2 | 7/2018 | Kuroda |
| 10,404,932 B2 | 9/2019 | Kuroda et al. |
| 10,609,320 B2 | 3/2020 | Kuroda et al. |
| 10,652,496 B2 | 5/2020 | Goden et al. |
| 10,991,541 B2 | 4/2021 | Ikeda et al. |
| 11,069,823 B2 | 7/2021 | Kuroda |
| 11,172,147 B2 | 11/2021 | Kuroda |
| 2012/0175503 A1 | 7/2012 | Kuroda et al. |
| 2013/0308019 A1 | 11/2013 | Fukuoka |
| 2015/0281610 A1 | 10/2015 | Ota et al. |
| 2020/0158566 A1 | 5/2020 | Ota et al. |
| 2021/0044768 A1 | 2/2021 | Kuroda |
| 2022/0014698 A1 | 1/2022 | Sasago et al. |
| 2022/0115366 A1 * | 4/2022 | Ota .......................... G01J 1/44 |

\* cited by examiner

TEMPERATURE COMPENSATION REFLECTING INDIVIDUAL VALUE

SLOPE IS DIFFERENT FROM THE MIDDLE

PHOTOELECTRIC CONVERSION APPARATUS, PHOTO-DETECTION SYSTEM, AND MOVABLE BODY

BACKGROUND OF THE INVENTION

Field of the Invention

The present invention relates to a photoelectric conversion apparatus, a photo-detection system, and a movable body.

Description of the Related Art

Conventionally, avalanche photodiodes (APD) are known that utilize avalanche (electron avalanche) multiplication to enable detection of faint light at a single photon level. The breakdown voltage that causes avalanche multiplication depends on the temperature of an APD, and the output characteristic of the APD may vary in accordance with a temperature change.

U.S. Pat. No. 9,978,885 discloses an SiPM device having a matrix of silicon photomultipliers (SiPM) that is an array of APDs formed on a substrate, a bias power source connected to the matrix of SiPMs, and a compensation circuit coupled to the bias power source. In the device disclosed in U.S. Pat. No. 9,978,885, the compensation circuit adjusts a bias voltage applied to the SiPM matrix in response to a temperature change of the substrate.

In the device disclosed in U.S. Pat. No. 9,978,885, if actual detection of a temperature change is needed, it is required to form a circuit that generates a value corresponding to the temperature of an APD and/or the periphery thereof. In such a case, a process for manufacturing metal oxide semiconductor field effect transistors (MOSFET) is required to be performed on the substrate on which APDs are arranged. Thus, in the device disclosed in U.S. Pat. No. 9,978,885, as a result of the device going through a process which is originally unnecessary for forming APDs, it may be difficult to optimize the characteristic of the APDs.

SUMMARY OF THE INVENTION

Accordingly, concerning a photoelectric conversion apparatus that generates a value corresponding to the temperature of an APD and/or the periphery thereof, the object of the present invention is to provide a photoelectric conversion apparatus, a photo-detection system, and a movable body that can easily optimize the characteristic of the APD.

According to one aspect of the present invention, provided is a photoelectric conversion apparatus including: a first substrate including an avalanche photodiode; and a second substrate, in which the first substrate and the second substrate are stacked on each other, and further including: a temperature detection unit arranged in at least one of the first substrate and the second substrate and having an output characteristic depending on a temperature; and a temperature value generating circuit arranged outside the first substrate and configured to convert output from the temperature detection unit into a temperature value signal that is a signal indicating temperature information.

Further features of the present invention will become apparent from the following description of exemplary embodiments with reference to the attached drawings.

DESCRIPTION OF THE EMBODIMENTS

First Embodiment

A photoelectric conversion apparatus according to a first embodiment of the present invention will be described with reference to FIG. 1 to FIG. 6.

Figure 1:
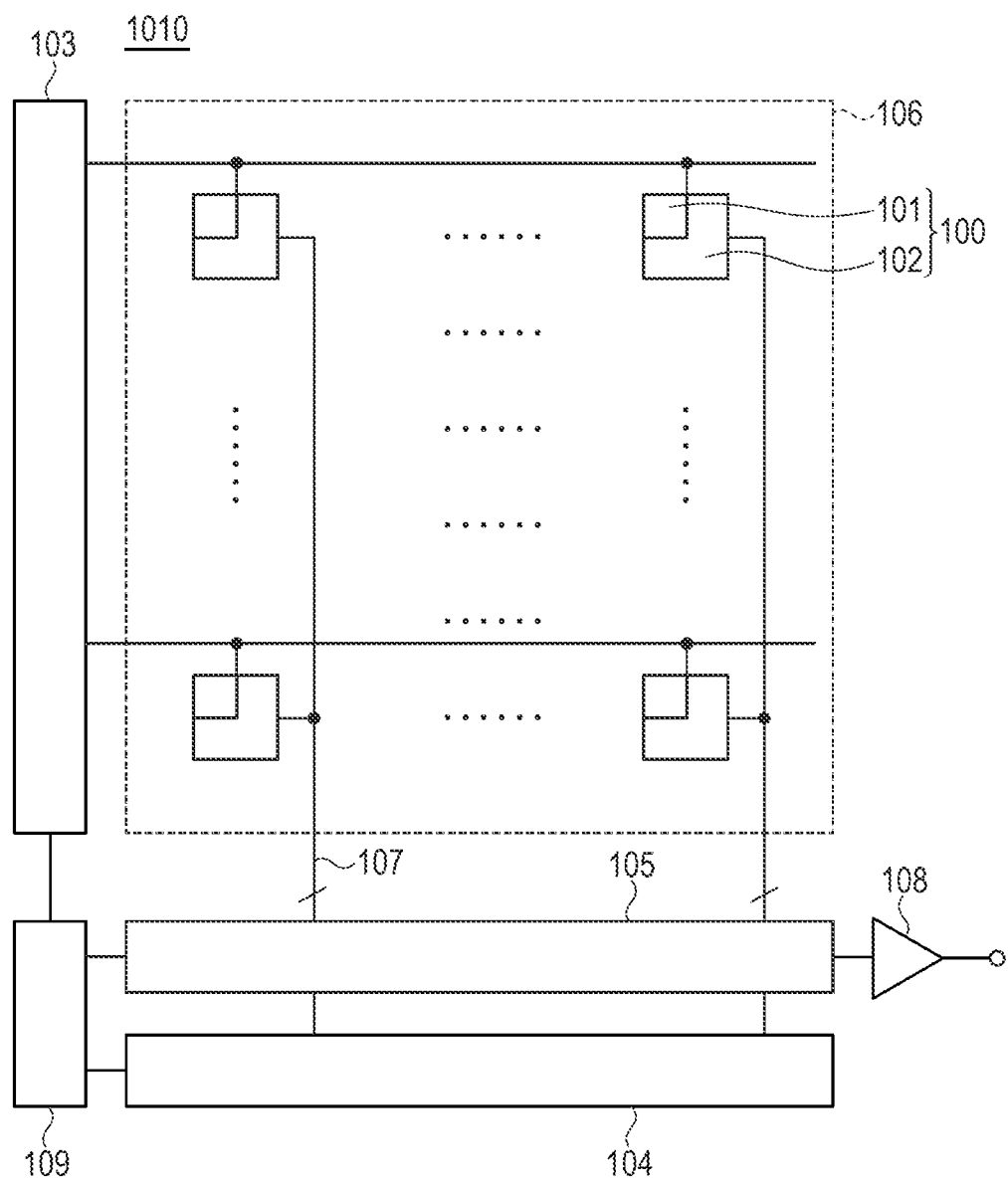
FIG. 1 is a block diagram illustrating a general configuration of a photoelectric conversion apparatus according to a first embodiment of the present invention.

First, a general configuration of the photoelectric conversion apparatus according to the present embodiment will be described with reference to FIG. 1. FIG. 1 is a block diagram illustrating the general configuration of the photoelectric conversion apparatus 1010 according to the present embodiment.

As illustrated in FIG. 1, a photoelectric conversion apparatus 1010 has a vertical selection circuit 103, a horizontal selection circuit 104, a column circuit 105, a pixel unit 106, signal lines 107, an output circuit 108, and a control circuit 109.

The pixel unit 106 has a plurality of pixels 100 arranged in a matrix. Each of the pixels 100 includes a photoelectric conversion element 101 and a signal processing unit 102 that processes a signal output from the pixel. The photoelectric conversion element 101 photoelectrically converts incident light into an electrical signal. The signal processing unit 102 outputs the converted electrical signal to the column circuit 105.

Note that, in the present specification, "light" may include electromagnetic waves of any wavelengths. That is, "light" is not limited to visible light and may include invisible light such as infrared ray, ultraviolet ray, X-ray, gamma ray, or the like.

The control circuit 109 generates control pulses to drive the vertical selection circuit 103, the horizontal selection circuit 104, and the column circuit 105 and supplies the control pulses to those circuits. Accordingly, the control circuit 109 controls drive timings or the like of respective circuits. Note that the vertical selection circuit 103, the horizontal selection circuit 104, and the column circuit 105 may be driven by control pulses supplied from outside of the photoelectric conversion apparatus 1010.

The vertical selection circuit 103 supplies a control signal to each of the plurality of pixels 100 based on the control signals supplied from the control circuit 109. As illustrated in FIG. 1, the vertical selection circuit 103 supplies a control signal to respective pixels 100 on a row basis via control signal lines provided on respective rows of the pixel unit 106. Logic circuits such as a shift register, an address decoder, or the like may be used for the vertical selection circuit 103.

The signal line 107 is provided on each row of the pixel unit 106 and transfers a signal output from the pixel 100 on a row selected by the vertical selection circuit 103 to the column circuit 105, which is the post stage of the pixel 100, as a digital signal. The column circuit 105 performs a predetermined process on signals from respective pixels 100 input via the signal lines 107. The predetermined process is, for example, a process such as noise removal, amplification, conversion of output forms, or the like performed on an input signal. To implement these functions, the column circuit 105 may have a parallel-to-serial conversion circuit or the like.

The horizontal selection circuit 104 supplies, to the column circuit 105, control pulses used for sequentially outputting signals, which have been subjected to a predetermined process, to the output circuit 108 based on the control pulses supplied from the control circuit 109. The output circuit 108 includes a buffer amplifier, a differential amplifier, or the like and outputs a signal, which has been output from the column circuit 105, to a storage unit or a signal processing circuit outside the photoelectric conversion apparatus 1010.

In FIG. 1, the arrangement of the pixels 100 within the pixel unit 106 may be one dimensional or may be formed of only one pixel 100. When the pixels 100 within the pixel unit 106 are divided into some blocks, multiple sets of vertical selection circuits 103, horizontal selection circuits 104, and column circuits 105 may be arranged in association with respective blocks. Further, the horizontal selection circuits 104 and the column circuits 105 may be arranged on a column basis.

The signal processing units 102 may not be necessarily required to be provided to all the pixels 100 in a one-to-one manner. For example, a single signal processing unit 102 may be shared by a plurality of pixels 100. In such a case, the signal processing unit 102 sequentially processes signals output from respective photoelectric conversion elements 101 and thereby provides a function of signal processing to respective pixels.

Further, the signal processing unit 102 may be provided on a semiconductor substrate that is different from a semiconductor substrate on which the photoelectric conversion element 101 is provided. In such a case, it is possible to improve sensitivity by improving the ratio of the area that the photoelectric conversion elements 101 can receive light (aperture ratio). The photoelectric conversion element 101 and the signal processing unit 102 are electrically connected to the signal line 107 via a connection wiring provided for each pixel 100. Each of the signal lines 107 may include n signal lines to transfer an n-bit digital signal. Note that, similarly to the signal processing unit 102, the vertical selection circuit 103, the horizontal selection circuit 104, and the column circuit 105 may be provided on a semiconductor substrate that is different from a semiconductor substrate on which the photoelectric conversion elements 101 are provided.

Figure 2:
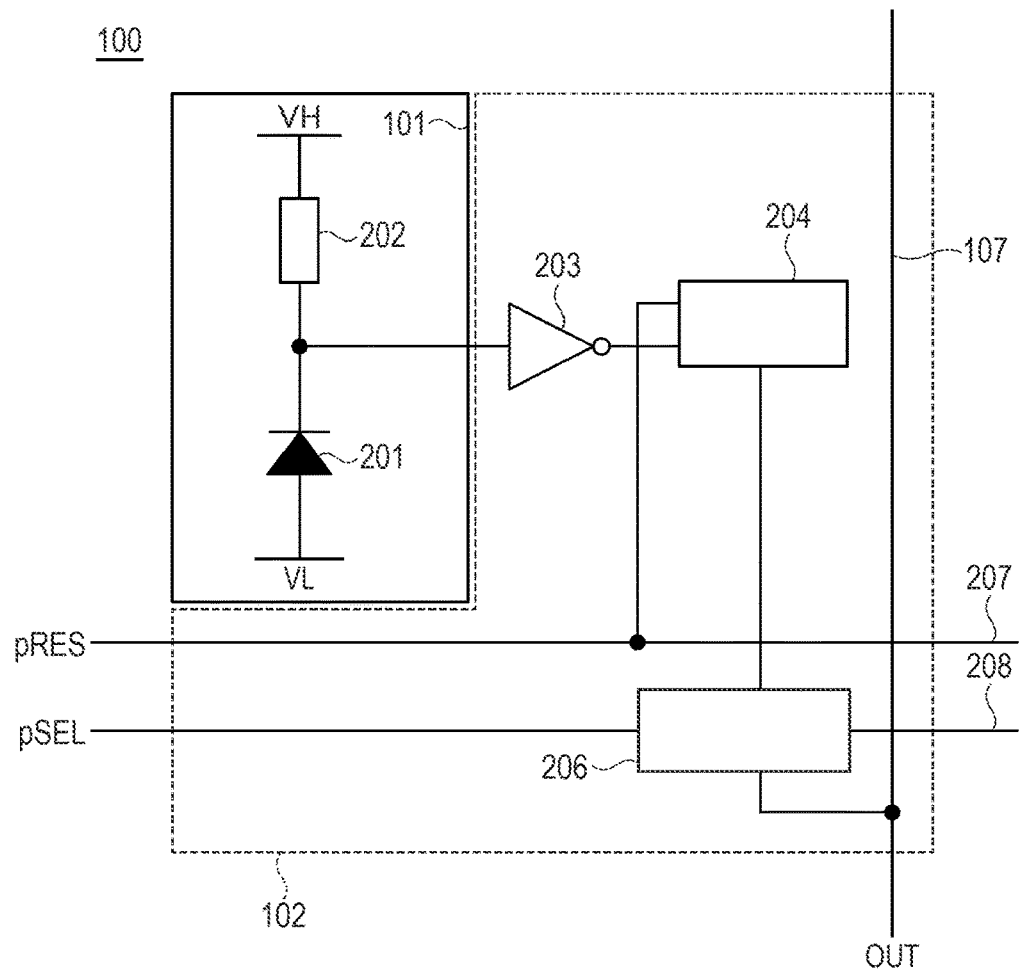
FIG. 2 is a block diagram illustrating a pixel in the photoelectric conversion apparatus according to the first embodiment of the present invention.

Next, a configuration of the pixel 100 in the photoelectric conversion apparatus 1010 according to the present embodiment will be described with reference to FIG. 2. FIG. 2 is a block diagram illustrating the pixel 100 in the photoelectric conversion apparatus 1010 according to the present embodiment.

As illustrated in FIG. 2, the pixel 100 has the photoelectric conversion element 101 and the signal processing unit 102. The photoelectric conversion element 101 has a photoelectric conversion portion 201 and a control unit 202. Note that, although both the photoelectric conversion portion 201 and the control unit 202 are provided on the same semiconductor substrate in FIG. 2, the control unit 202 may be provided on a different semiconductor substrate from that for the photoelectric conversion portion 201.

The photoelectric conversion portion 201 generates a pair of charges in accordance with incident light by photoelectric conversion. An avalanche photodiode (APD) 13 described later is used for the photoelectric conversion portion 201. Respective predetermined potentials are supplied to the anode and the cathode of the photoelectric conversion portion 201. The potential VH supplied to the cathode of the photoelectric conversion portion 201 is higher than the potential VL supplied to the anode.

Herein, potentials are supplied to the anode and the cathode of the photoelectric conversion portion 201 so that a reverse bias potential difference is applied by which charges occurring in the photoelectric conversion portion 201 may trigger avalanche multiplication. In such a state where a reverse bias potential difference is supplied, when charges occur due to incident light, avalanche current occurs by avalanche multiplication.

Note that, when a reversely biased potential difference is supplied, if the potential difference between the anode and the cathode is larger than the breakdown voltage of an avalanche diode, the avalanche diode operates in a Geiger mode. A photodiode that detects a weak signal at a single photon level in the Geiger mode is called a single photon avalanche diode (SPAD).

Further, if the potential difference between the anode and the cathode is larger than or equal to the potential difference by which charges occurring in the photoelectric conversion portion 201 triggers avalanche multiplication and lower than or equal to the breakdown voltage, the avalanche diode operates in a linear mode. An avalanche diode that performs photo-detection in the linear mode is called an avalanche photodiode (APD). In the present embodiment, the photoelectric conversion portion 201 may operate as an avalanche photodiode of any of a SPAD and an APD.

The control unit 202 is connected to a power source voltage that supplies the high potential VH and the photoelectric conversion portion 201. Once charges are multiplied by avalanche multiplication in the photoelectric conversion portion 201, current obtained by the multiplied charges flows to the connection node between the photoelectric conversion portion 201 and the control unit 202. Due to a voltage drop by this current, the potential of the cathode of the photoelectric conversion portion 201 decreases, and the photoelectric conversion portion 201 no longer forms any electron avalanche. Accordingly, avalanche multiplication of the photoelectric conversion portion 201 stops. Then, since the potential VH of the power source is supplied to the cathode of the photoelectric conversion portion 201 via the control unit 202, the potential supplied to the cathode of the photoelectric conversion portion 201 increases back to the potential VH. In such a way, the control unit 202 functions as a load circuit (quench circuit) during multiplication of charges by avalanche multiplication and works to reduce the voltage supplied to the photoelectric conversion portion 201 and reduce avalanche multiplication (quench operation). A specific example of circuit elements forming the control unit 202 may be a resistor element or a quench circuit. The quench circuit may be a passive quench circuit or may be an active quench circuit that detects an increase in avalanche current to perform feedback control and thereby actively suppresses avalanche multiplication.

The signal processing unit 102 has a waveform shaper 203, a counter circuit 204, and a selector circuit 206. The waveform shaper 203 reshapes a voltage change and outputs a pulse signal when a signal voltage at a single photon level is input from the photoelectric conversion element 101. A specific example of circuit elements forming the waveform shaper 203 may be an inverter circuit. Although FIG. 2 illustrates a circuit configuration provided with one inverter circuit as the waveform shaper 203, other circuits may be used as long as a waveform shaping effect is obtained. For example, the waveform shaper 203 may be a circuit in which a plurality of inverter circuits are connected in series.

The counter circuit 204 counts the number of pulses of a pulse signal output from the waveform shaper 203. The counter circuit 204 may be, for example, an N-bit counter (N: positive integer). In such a case, the counter circuit 204 can count the number of pulses up to about N power of 2 at the maximum. The counted number is held in the counter circuit 204 as a detection signal. Further, a control pulse pRES may be supplied to the counter circuit 204 via a drive line 207 from the vertical selection circuit 103 illustrated in FIG. 1. Once the control pulse pRES is supplied to the counter circuit 204, the held counted number is reset.

The selector circuit 206 switches electrical connection/disconnection between the counter circuit 204 and the signal line 107. A control pulse pSEL is supplied to the selector circuit 206 via a drive line 208 from the vertical selection circuit 103 illustrated in FIG. 1. Once the control pulse pSEL is supplied to the selector circuit 206, electrical connection/disconnection between the counter circuit 204 and the signal line 107 is switched in accordance with the level of the control pulse pSEL. The selector circuit 206 may include a transistor, a buffer circuit for outputting a signal to outside of the pixel 100, or the like, for example. Once the counter circuit 204 and the signal line 107 are electrically connected to each other, a digital signal indicating a counted value of a detection signal held in the counter circuit 204 is transferred to the signal line 107.

Note that, instead of the selector circuit 206, switches such as transistors may be provided to the node between the control unit 202 and the photoelectric conversion portion 201, the node between the photoelectric conversion element 101 and the signal processing unit 102, or the like. Also in such a case, the function similar to the selector circuit 206 can be implemented by switching connection/disconnection of the switches. Similarly, the function similar to the selector circuit 206 may be implemented also by using a switch such as a transistor to switch whether or not to supply the potential to be supplied to the control unit 202 or the photoelectric conversion element 101.

Respective pixels 100 of the pixel unit 106 may be driven by a rolling shutter operation or a global electronic shutter operation. Signals acquired from respective pixels 100 may be used for generating an image based on incident light to the pixel unit 106.

The rolling shutter operation is an operation to perform reset of counted values in the counter circuits 204 and output of signals from the counter circuits 204 sequentially at different timings on a row basis. The global electronic shutter operation is an operation to perform reset of counts in the counter circuits 204 simultaneously on all the rows and then output signals held in the counter circuits 204 sequentially on a row basis.

Note that, when the global electronic shutter operation is performed, it is preferable to further add a unit that switches whether or not to perform counting in the counter circuit 204 in order to have the same time to perform counting of pulses for respective rows. The unit that switches whether or not to perform counting may be, for example, a switch such as a transistor.

Further, instead of the counter circuit 204, a Time to Digital Converter (hereafter, referred to as a TDC) and a memory may be provided. In such a case, the photoelectric conversion apparatus 1010 can acquire a timing that a pulse was detected.

In this modified example, the generation timing of a pulse signal output from the waveform shaper 203 is converted into a digital signal by the TDC. Control pulses pREF are supplied to the TDC as a reference signal used in measurement of timings of the pulse signal from the vertical selection circuit 103 via a drive line. The TDC acquires a digital signal corresponding to input time of a pulse from the waveform shaper 203 by using the control pulse pREF as a reference of time.

For the circuit of the TDC, for example, a delay line scheme in which a delay circuit is formed using a delay line formed of buffer circuits connected in series, a looped TDC scheme in which a circuit formed of delay lines connected in a loop is used, or the like may be used. Although other schemes may be used for the circuit of the TDC, to ensure sufficient time resolution, it is preferable to use a scheme that can achieve time resolution that is the same as or higher than the time resolution of the photoelectric conversion portion 201.

The digital signal acquired by the TDC is held in one or a plurality of memories. When a plurality of memories are used, it is possible to cause any of the plurality of memories to selectively output a signal to the signal line 107 by supplying a plurality of control pulses pSEL to the selector circuit 206.

Figure 3:
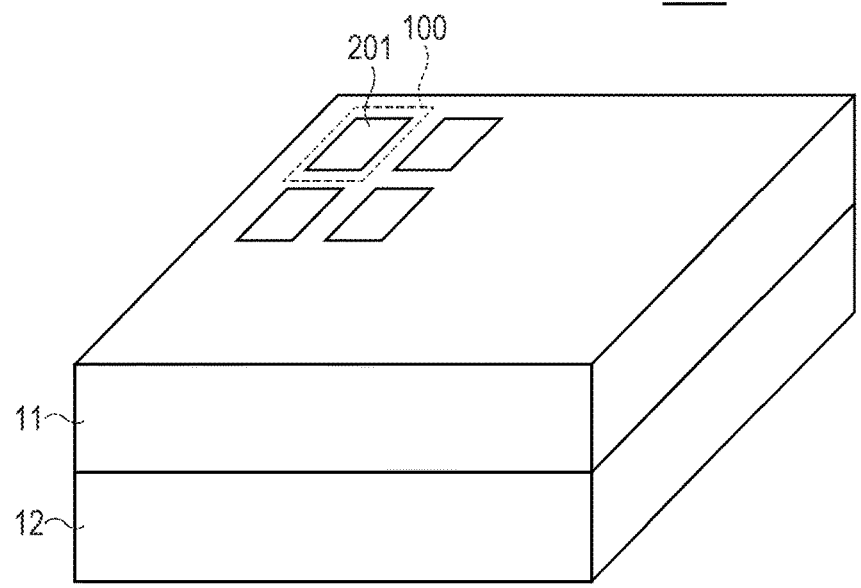
FIG. 3 is a perspective view illustrating the photoelectric conversion apparatus according to the first embodiment of the present invention.

Next, the stacked structure of the photoelectric conversion apparatus 1010 according to the present embodiment will be described with reference to FIG. 3. FIG. 3 is a perspective view illustrating the photoelectric conversion apparatus 1010 in the present embodiment.

The photoelectric conversion apparatus 1010 is formed of a plurality of stacked substrates. For example, the photoelectric conversion apparatus 1010 includes a first substrate 11 in which a plurality of photoelectric conversion portions 201 are formed and a second substrate 12 in which a plurality of signal processing units 102 are formed. Each of the first substrate 11 and the second substrate 12 has a semiconductor substrate and a wiring layer. The wiring layer has an insulator such as an oxide film and a metal layer such as copper. The photoelectric conversion portion 201 is arranged inside the semiconductor substrate of the first substrate 11. Further, the counter circuit 204 and the like are arranged in the semiconductor substrate of the second substrate 12. The first substrate 11 and the second substrate 12 are attached to each other at bonding surfaces. The bonding surface is formed of a metal such as copper and an insulator such as an oxide film. The metal forming the bonding surface may form wirings connected between the photoelectric conversion portions 201 arranged in the first substrate 11 and circuits such as the counter circuits 204 arranged in the second substrate 12.

Optical members such as a color filter, micro lenses, or the like are arranged on the first primary surface, that is, the light incidence surface of the first substrate 11. The second substrate 12 is stacked on the second primary surface of the first substrate 11. A group of circuits forming one pixel 100 are divided into and formed in the first substrate 11 and the second substrate 12. This can prevent an increase in the area of the photoelectric conversion apparatus in plan view while realizing a higher speed or a larger scale of the digital circuit including the counter circuit. Note that the photoelectric conversion portions 201 and the signal processing units 102 may be arranged side by side on one of the substrates.

Further, a temperature detection unit 14 described later is formed in the first substrate 11. Further, a temperature value generating circuit 15 described later is formed in the second substrate 12.

Next, a configuration including APDs 13, the temperature detection unit 14, the temperature value generating circuit 15, and a signal processing circuit 16 of the photoelectric conversion apparatus 1010 according to the present embodiment will be described with reference to FIG. 4A to FIG. 6.

Figure 4A:
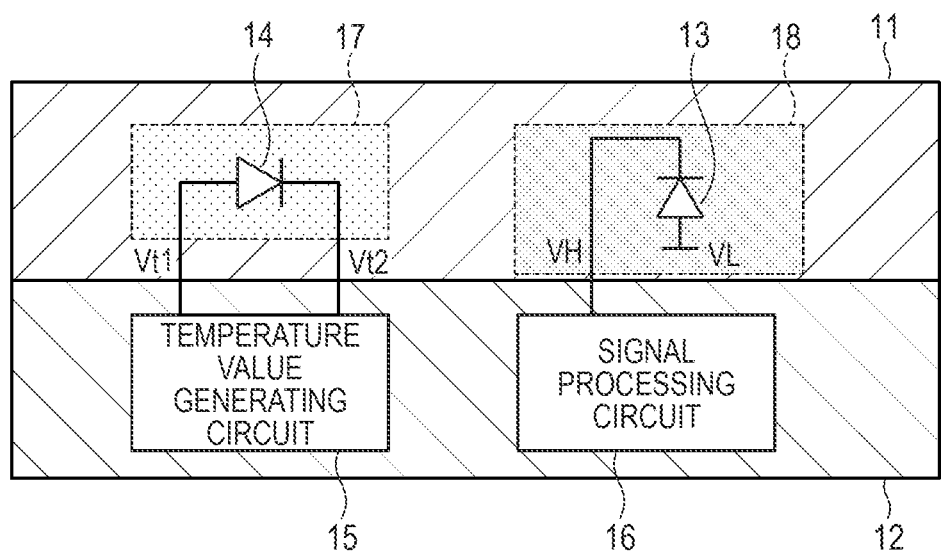
FIG. 4A and FIG. 4B are sectional views illustrating the photoelectric conversion apparatus according to the first embodiment of the present invention.
Figure 4B:
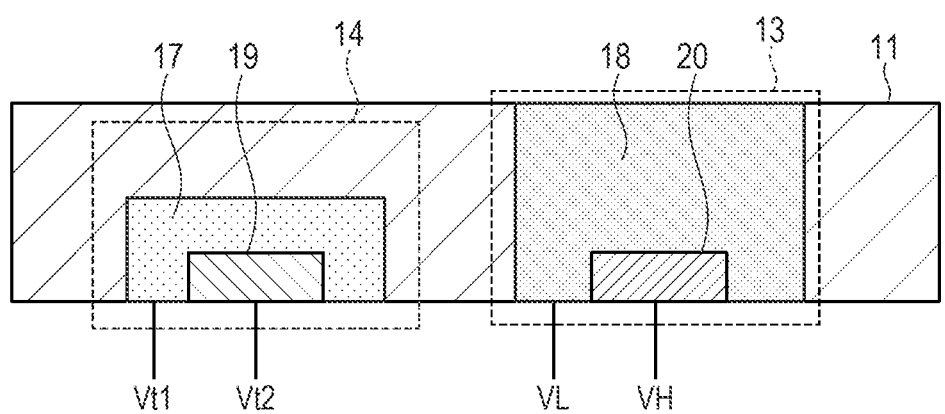

FIG. 4A is a sectional view illustrating the configuration including the first substrate 11 and the second substrate 12 of the photoelectric conversion apparatus 1010 according to the present embodiment. FIG. 4B is a sectional view illustrating the device structure of the first substrate 11 of the photoelectric conversion apparatus 1010 according to the present embodiment.

As illustrated in FIG. 4A, the photoelectric conversion apparatus 1010 according to the present embodiment includes the first substrate 11 and the second substrate 12 and has the stacked structure in which the first substrate 11 and the second substrate 12 are stacked to each other and electrical connections are provided between circuits, between circuit elements, and the like. The semiconductor substrate of the first substrate 11 includes the APD 13 and the temperature detection unit 14. The semiconductor substrate of the second substrate 12 includes the temperature value generating circuit 15 and the signal processing circuit 16. Although depiction of wiring layers is omitted in FIG. 4A and FIG. 4B, a wiring layer is arranged on the second substrate side of the first substrate, and a wiring layer is arranged on the first substrate side of the second substrate.

The APD 13 is formed and arranged in the semiconductor substrate of the first substrate 11. The APD 13 functions as the photoelectric conversion portion 201 of the photoelectric conversion element 101 illustrated in FIG. 2. The cathode of the APD 13 is electrically connected to the signal processing circuit 16. A photon reaching the APD 13 is photoelectrically converted and avalanche-multiplied in the APD 13 and then subjected to signal processing in the signal processing circuit 16. The signal processing circuit 16 may include a quench resistor, a reset mechanism, or the like. In such a way, the signal processing circuit 16 that processes an output signal of the APD 13 functions as the control unit 202 illustrated in FIG. 2.

The temperature detection unit 14 is formed and arranged in the first substrate 11. The temperature detection unit 14 detects the temperature of the first substrate 11 having the APD 13 formed therein and performs output in accordance with the temperature of the first substrate 11. The temperature detection unit 14 is, for example, an element or a circuit having an output characteristic depending on the temperature of the first substrate 11 having the APD 13 formed therein, which is specifically a diode, a ring oscillator, or the like. The temperature of the first substrate 11 detected by the temperature detection unit 14 is substantially the same as or has a predetermined relationship with the temperature of the APD 13 and indicates a value corresponding to the temperature of the APD 13. The temperature detection unit 14 is electrically connected to the temperature value generating circuit 15. Note that the temperature detection unit 14 may be arranged in at least one of the first substrate 11 and the second substrate 12.

The temperature value generating circuit 15 is formed and arranged in the second substrate 12 outside the first substrate 11. The temperature value generating circuit 15 is a circuit that converts output from the temperature detection unit 14 into a temperature value signal, which is a signal indicating temperature information corresponding to the temperature of the first substrate 11, and outputs the temperature value signal. For example, when the temperature detection unit 14 is a diode, the temperature value generating circuit 15 measures the voltage between both terminals of the diode when constant current is input to the diode and converts the measured voltage into a temperature value signal. In such a case, for example, the temperature value generating circuit 15 is a resistor element or an amplifier circuit in the case of an analog output or includes an analog-to-digital (AD) converter circuit in the case of digital output. Further, for example, when the temperature detection unit 14 is a ring oscillator, the temperature value generating circuit 15 counts the oscillation frequency of the ring oscillator and converts the counted oscillation frequency into a temperature value signal. In such a case, the temperature value generating circuit 15 is a counter circuit, for example. Note that the temperature value signal is not limited to a signal corresponding to the temperature of the first substrate 11 detected by the temperature detection unit 14 and may be a signal corresponding to the temperature of the APD 13 estimated from the temperature of the first substrate 11. The temperature value generating circuit 15 can be configured to output a temperature value signal having temperature accuracy of 5 degrees Celsius or less, for example, in order to realize accurate temperature compensation.

FIG. 4A and FIG. 4B illustrate an example in which the temperature detection unit 14 is a diode. In such a case, the temperature value generating circuit 15 converts the voltage difference between the anode voltage Vt1 and the cathode voltage Vt2, which is obtained when constant current is caused to flow in the temperature detection unit 14 that is a diode, into a temperature value signal and outputs the temperature value signal.

Herein, the power source voltage VL of the APD 13 formed in the first substrate 11, which is the same substrate as that with the temperature detection unit 14, is required to have a high voltage difference relative to the signal voltage VH in order to realize avalanche multiplication. Therefore, the power source voltage VL of the APD 13 has a different range from the operation voltages (Vt1, Vt2) of the temperature detection unit 14.

Thus, as illustrated in FIG. 4A, the temperature detection unit 14 is formed inside a first impurity region 17, and the APD 13 is formed inside a second impurity region 18. Accordingly, the temperature detection unit 14 and the APD 13 are isolated and arranged in well regions different from each other. That is, as illustrated in FIG. 4B, the temperature detection unit 14 is formed as a diode including p-n junction between the first impurity region 17 and a third impurity region 19 formed inside the first impurity region 17. On the other hand, the APD 13 is formed as a diode including p-n junction between the second impurity region 18 and a fourth impurity region 20 formed inside the second impurity region 18. In such a way, the temperature detection unit 14 and the APD 13 are isolated from each other in respective wells.

For example, when the first substrate 11 is an N-type semiconductor substrate and a power source voltage of 1 [V] is applied, the anode can be the P-type of the first impurity region 17 of 0 to 1 [V], and the cathode can be the N-type of the third impurity region 19 of 0 [V] in the temperature detection unit 14. Further, in such a case, the anode can be the P-type of the second impurity region 18 of minus several tens volt [V], and the cathode can be the N-type of the fourth impurity region 20 of 0 to 1 [V] in the APD 13.

Figure 5A:
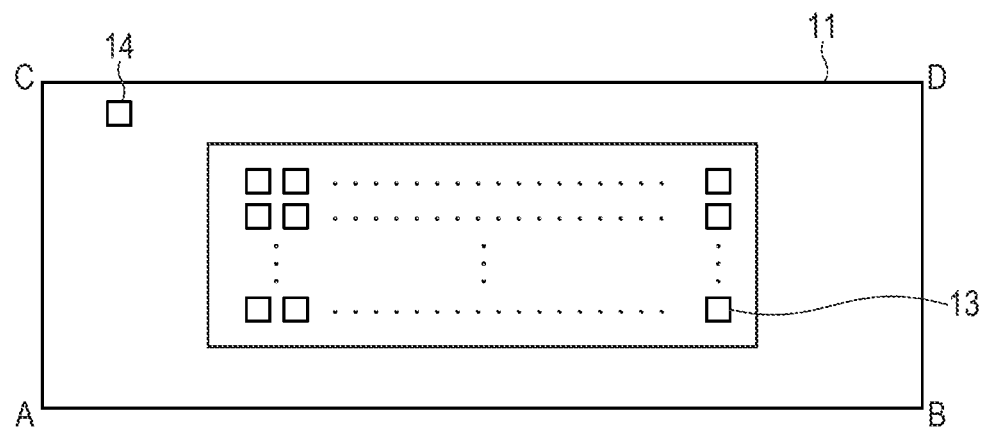
FIG. 5A and FIG. 5B are plan views illustrating the photoelectric conversion apparatus according to the first embodiment of the present invention.
Figure 5B:
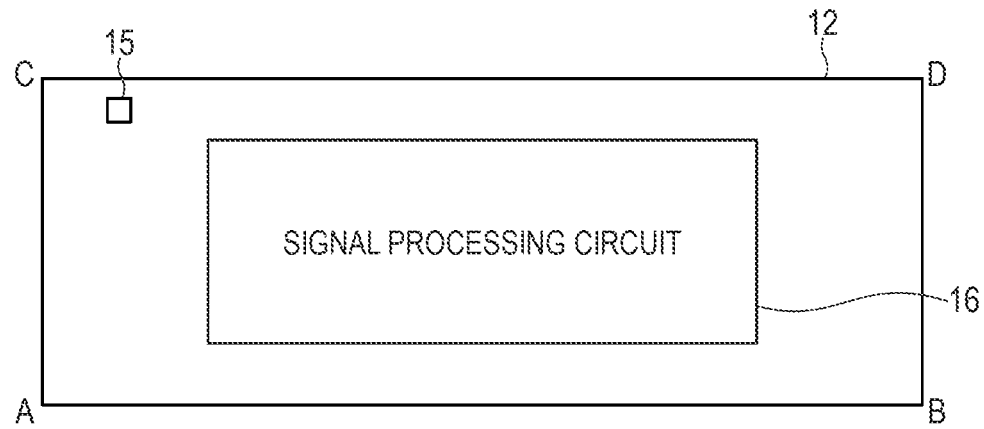

FIG. 5A is a plan view illustrating the first substrate 11 in the photoelectric conversion apparatus 1010 according to the present embodiment. FIG. 5B is a plan view illustrating the second substrate 12 in the photoelectric conversion apparatus 1010 according to the present embodiment. The vertexes A, B, C, and D of the first substrate 11 illustrated in FIG. 5A correspond to the vertexes A, B, C, and D of the second substrate 12 illustrated in FIG. 5B, respectively, to overlap each other.

As illustrated in FIG. 5A, a plurality of APDs 13 are arranged in an array in the first substrate 11. Note that a single APD 13 may be arranged in the first substrate, or a plurality of APDs 13 may be arranged in a line other than arranged in an array.

As illustrated in FIG. 5B, the signal processing circuit 16 that processes signals of the APDs 13 is arranged to correspond to the planar position of the APDs 13 and electrically connected to the APDs 13 in the second substrate 12. The signal processing circuit 16 is configured to process output signals of respective APDs 13 individually, respectively. Further, the signal processing circuit 16 may be configured to collect output signals from a plurality of APDs 13 into one signal and process the one signal as with Silicon Photomultipliers (SiPM).

The temperature detection unit 14 and the temperature value generating circuit 15 are arranged at close positions of the first substrate 11 and the second substrate 12, respectively, which can be easily electrically connected to each other on a plane.

Figure 6:
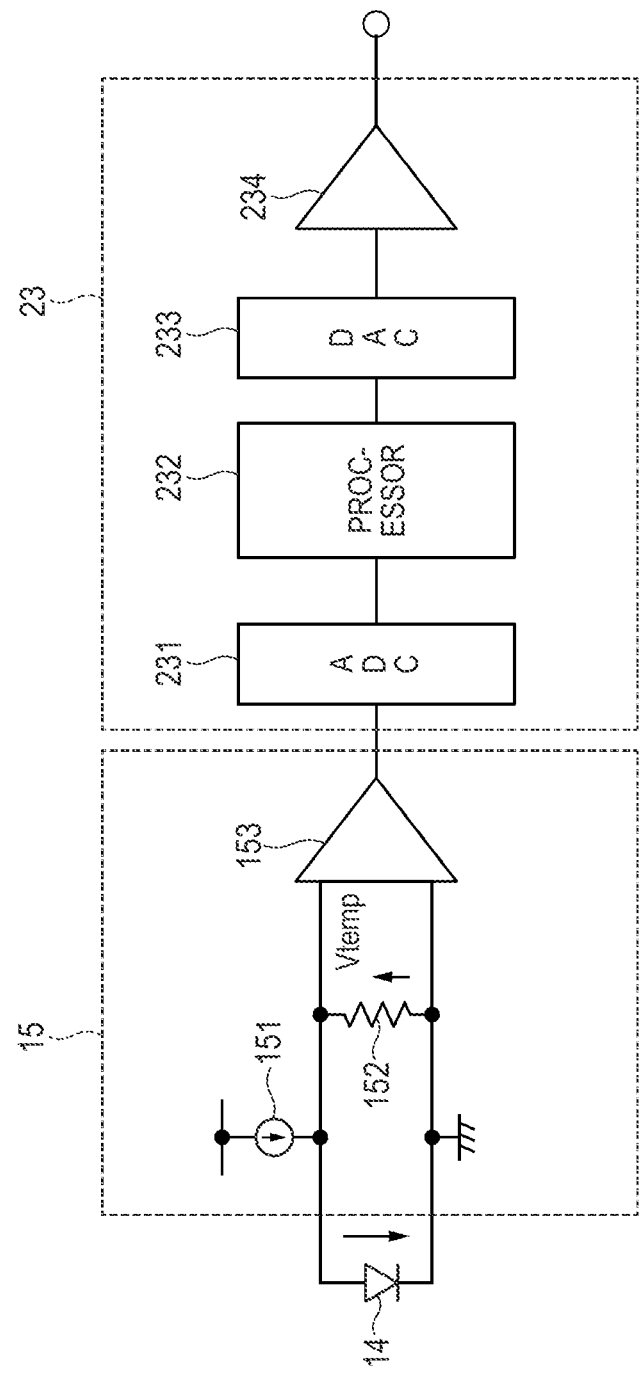
FIG. 6 is a block diagram illustrating a temperature detection unit, a temperature value generating circuit, and a temperature compensation circuit in the photoelectric conversion apparatus according to the first embodiment of the present invention.

FIG. 6 is a block diagram illustrating the temperature detection unit 14, the temperature value generating circuit 15, and a compensation circuit 23 in the photoelectric conversion apparatus 1010 according to the present embodiment. The photoelectric conversion apparatus 1010 according to the present embodiment further has the compensation circuit 23. The configuration of the temperature detection unit 14, the temperature value generating circuit 15, and the compensation circuit 23 is not limited to the configuration illustrated in FIG. 6, and various configurations may be employed.

As illustrated in FIG. 6, the temperature value generating circuit 15 is electrically connected to the temperature detection unit 14. The temperature value generating circuit 15 has a current source 151, a resistor element 152, and an amplifier 153. The temperature value generating circuit 15 is electrically connected to the compensation circuit 23. The compensation circuit 23 has an analog-to-digital converter (ADC) 231, a processor 232, a digital-to-analog converter (DAC) 233, and an amplifier 234.

The current source 151 supplies constant current to flow in the diode that is the temperature detection unit 14. One end and the other end of the resistor element 152 are connected to the anode and the cathode of the temperature detection unit 14, respectively. The amplifier 153 amplifies and outputs a voltage Vtemp applied to the resistor element 152 corresponding to the voltage difference between the anode voltage and the cathode voltage of the temperature detection unit 14. The voltage Vtemp has temperature dependency that depends on the temperature of the first substrate 11 in which the APDs 13 are formed. Accordingly, the amplifier 153 outputs a voltage signal amplified from the voltage Vtemp as a temperature value signal corresponding to the temperature of the first substrate 11 in which the APDs 13 are formed.

The temperature value signal is input to the compensation circuit 23 from the amplifier 153 of the temperature value generating circuit 15. The compensation circuit 23 is a compensation unit that, based on a temperature value signal from the temperature value generating circuit 15, compensates a change in the output characteristic that is in accordance with a temperature change of the APD 13. The ADC 231 converts a temperature value signal from the amplifier 153 from an analog signal into a digital signal and outputs the digital signal. Based on the temperature value signal converted into a digital signal by the ADC 231, the processor 232 outputs a signal for compensating a change in the output characteristic that is in accordance with a temperature change of the APD 13. Specifically, for example, based on a temperature value signal, the processor 232 can output a voltage signal corresponding to the power source voltage VL or VH applied to the APD 13. The voltage signal is applied to the APD 13 as the power source voltage VL or VH via conversion from a digital signal to an analog signal performed by the DAC 233 and amplification performed by the amplifier 234. In such a way, the processor 232 can compensate a change in the amplification factor with respect to a temperature change of the APD 13 and compensate a change in the output characteristic of the APD 13 by controlling the power source voltage VL or VH applied to the APD 13 based on a temperature value signal. Further, for example, based on a temperature value signal, the processor 232 can output a compensation signal that compensates the output from the APD 13 caused by the fact that the photon detection frequency of the APD 13 has changed in accordance with the temperature. Accordingly, the processor 232 can compensate the output from the APD 13 based on a temperature value signal to also compensate a change in the output characteristic of the APD 13.

Note that the compensation circuit 23 may be formed in the second substrate 12 together with the temperature value generating circuit 15 or may be formed outside such as in another substrate that is different from the first substrate 11 and the second substrate 12. Further, the circuit such as the temperature value generating circuit 15, the signal processing circuit 16, or the like included in the photoelectric conversion apparatus 1010 can also be configured to function as the compensation circuit 23. For example, the signal processing circuit 16 can function as the compensation circuit 23 by performing a sensitivity correction process such as changing the accumulation period to accumulate charges in the APD 13, reducing the counted numbers provided by the counter circuit 204, or the like based on a temperature value signal.

In the device disclosed in U.S. Pat. No. 9,978,885 described above, since the bias voltage is adjusted in accordance with a temperature change, it is required to acquire a value corresponding to the temperature of the APD. That is, the device disclosed in U.S. Pat. No. 9,978,885 requires a temperature value generating circuit that detects the temperature of the APD itself or the periphery thereof and outputs a value corresponding to the temperature value. When such a temperature value generating circuit is arranged in an APD substrate, which is a substrate in which the APD is formed, it is required to perform a process for manufacturing metal oxide semiconductor field effect transistors (MOSFET) on the APD substrate, and therefore, the number of steps will increase. Further, in such a case, it is required to perform a thermal treatment process specific to a MOSFET, such as a process of forming a gate oxide film, on the APD substrate. Thus, as a result of the device going through a process which is originally unnecessary for forming APDs, it may be difficult to optimize the characteristic of the APDs.

On the other hand, in the present embodiment, since the temperature value generating circuit 15 is arranged in the second substrate 12, which is different from the first substrate 11 in which the APDs 13 are arranged and is located outside the first substrate 11, the first substrate 11 including the APDs 13 is not required to go through a step of forming MOSFETs. Therefore, compared to the case where the APD 13 and the temperature value generating circuit 15 are arranged in the same substrate, the photoelectric conversion apparatus 1010 according to the present embodiment can be manufactured by a manufacturing process optimized for the characteristic of the APD 13. Therefore, according to the present embodiment, it is possible to easily improve and optimize the characteristic of the APD 13.

As described above, according to the present embodiment, in the photoelectric conversion apparatus 1010 that acquires a value corresponding to the temperature of the APD 13, it is possible to easily optimize the characteristic of the APD 13.

Further, in the present embodiment, since the temperature detection unit 14 is arranged in the first substrate 11 that is the same substrate as that with the APD 13, a temperature change of the APD 13 can be more accurately detected than in the case where both the temperature detection unit 14 and the APD 13 are arranged in different substrates from each other. Therefore, according to the present embodiment, the accuracy of temperature compensation to the characteristic of the APD 13 can be improved.

Second Embodiment

A photoelectric conversion apparatus according to a second embodiment of the present invention will be described with reference to FIG. 7 to FIG. 8B. Note that components similar to those in the photoelectric conversion apparatus according to the above first embodiment will be labeled with the same references, and the description thereof will be omitted or simplified.

The photoelectric conversion apparatus according to the present embodiment differs from that of the first embodiment in that the temperature detection unit 14 is not included in the first substrate 11 but is included in the second substrate 12.

Figure 7:
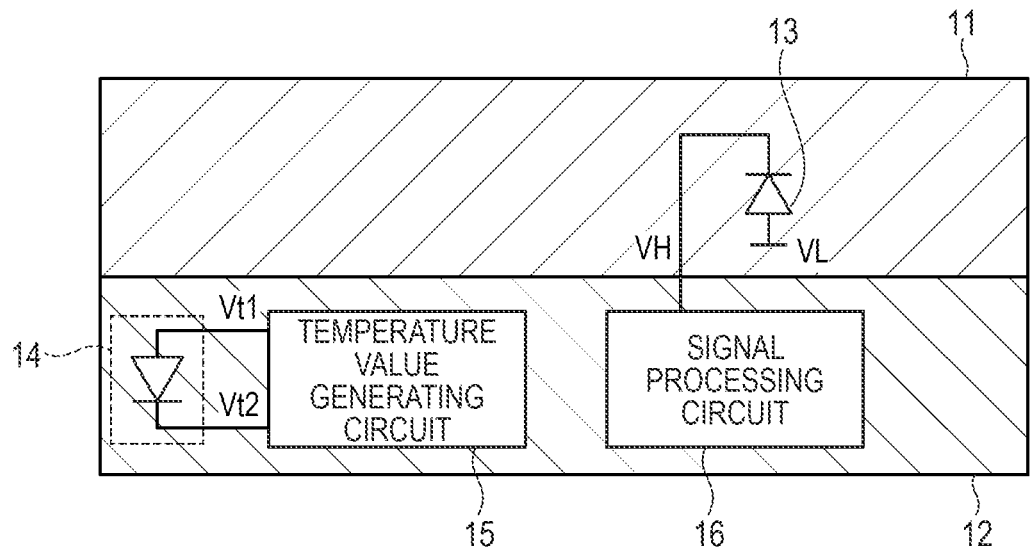
FIG. 7 is a sectional view illustrating a photoelectric conversion apparatus according to a second embodiment of the present invention.

FIG. 7 is a sectional view illustrating a configuration including the first substrate 11 and the second substrate 12 of the photoelectric conversion apparatus 1010 according to the present embodiment. As illustrated in FIG. 7, in the present embodiment, unlike the first embodiment, the temperature detection unit 14 is arranged in the second substrate 12 that is different from the first substrate 11 in which the APDs 13 are arranged.

As described above, in the present embodiment, unlike the first embodiment, the APD 13 and the temperature detection unit 14 are arranged in the first substrate 11 and the second substrate 12, respectively, which are different substrates from each other. Thus, in the present embodiment, the temperature detection unit 14 may be a circuit having temperature dependency on an output characteristic, such a ring oscillator, which includes a MOSFET and thus requires formation thereof or may be a temperature depending element such as a diode that does not require formation of a MOSFET. When the temperature detection unit 14 is a ring oscillator, for example, the temperature value generating circuit 15 monitors Vt1 as the input terminal voltage and Vt2 as the output terminal voltage to count the oscillation frequency and generates a temperature value signal from the counted value of the oscillation frequency.

Figure 8A:
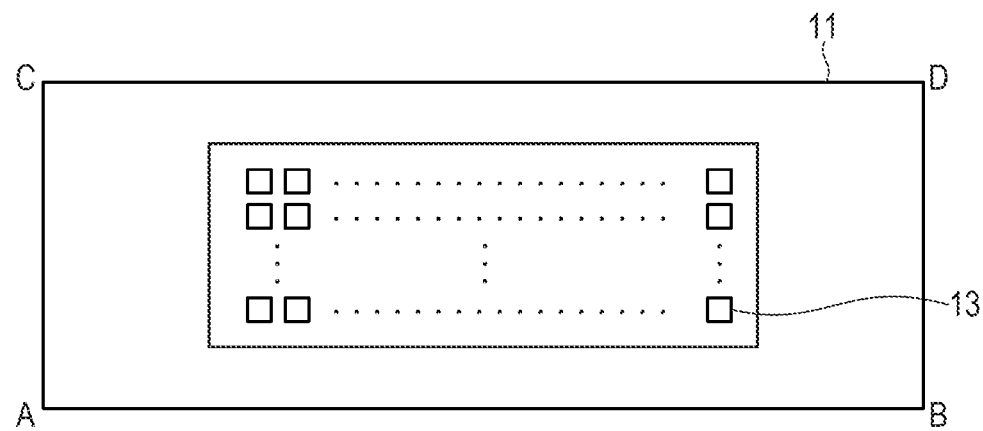
FIG. 8A and FIG. 8B are plan views illustrating the photoelectric conversion apparatus according to the second embodiment of the present invention.

FIG. 8A is a plan view illustrating the first substrate 11 in the photoelectric conversion apparatus 1010 according to the present embodiment. FIG. 8B is a plan view illustrating the second substrate 12 in the photoelectric conversion apparatus 1010 according to the present embodiment. The vertexes A, B, C, and D of the first substrate 11 illustrated in FIG. 8A correspond to the vertexes A, B, C, and D of the second substrate 12 illustrated in FIG. 8B, respectively, to overlap each other.

Figure 8B:
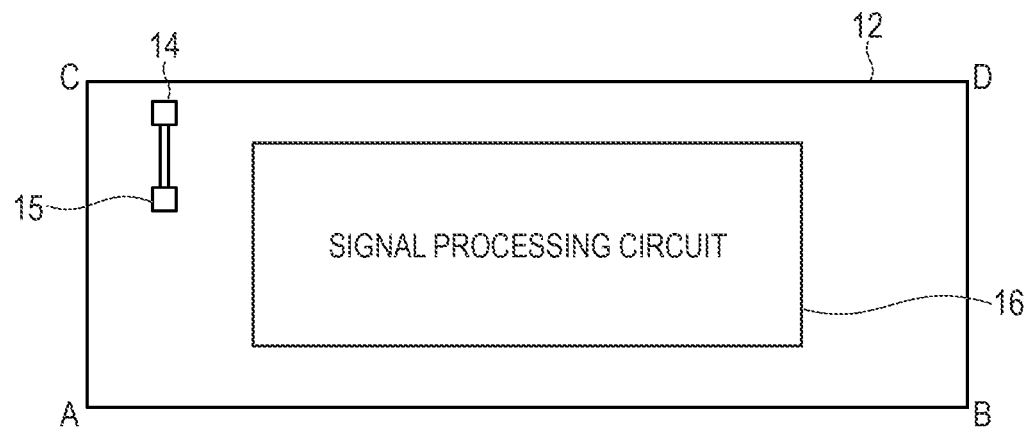

As illustrated in FIG. 8A and FIG. 8B, in the present embodiment, unlike the first embodiment, the temperature detection unit 14 is formed and arranged in the second substrate 12 instead of the first substrate 11 in which the APDs 13 are formed. The temperature detection unit 14 arranged in the second substrate 12 is electrically connected through the inside of the second substrate 12 to the temperature value generating circuit 15 similarly arranged in the second substrate 12.

In the present embodiment, similarly to the first embodiment, the first substrate 11 including the APDs 13 is not required to go through a step of forming MOSFETs. Thus, in the present embodiment, the photoelectric conversion apparatus 1010 can be manufactured by a manufacturing process optimized to the characteristic of the APD 13 compared to the case where the APDs 13 and the temperature value generating circuit 15 are arranged in the same substrate. Therefore, according to the present embodiment, it is possible to easily improve and optimize the characteristic of the APD 13.

Furthermore, in the present embodiment, the temperature detection unit 14 is not formed in the first substrate 11 in which the APDs 13 are formed. Thus, according to the present embodiment, the area occupied by the APDs 13 in the first substrate 11 can be increased compared to the first embodiment.

Third Embodiment

A photoelectric conversion apparatus according to a third embodiment of the present invention will be described with reference to FIG. 9 to FIG. 10B. Note that components similar to those in the photoelectric conversion apparatus according to the above first and second embodiments will be labeled with the same references, and the description thereof will be omitted or simplified.

The photoelectric conversion apparatus according to the present embodiment differs from that of the first embodiment in that the temperature detection units 14 are arranged in the second substrate 12 in addition to the first substrate 11.

Figure 9:
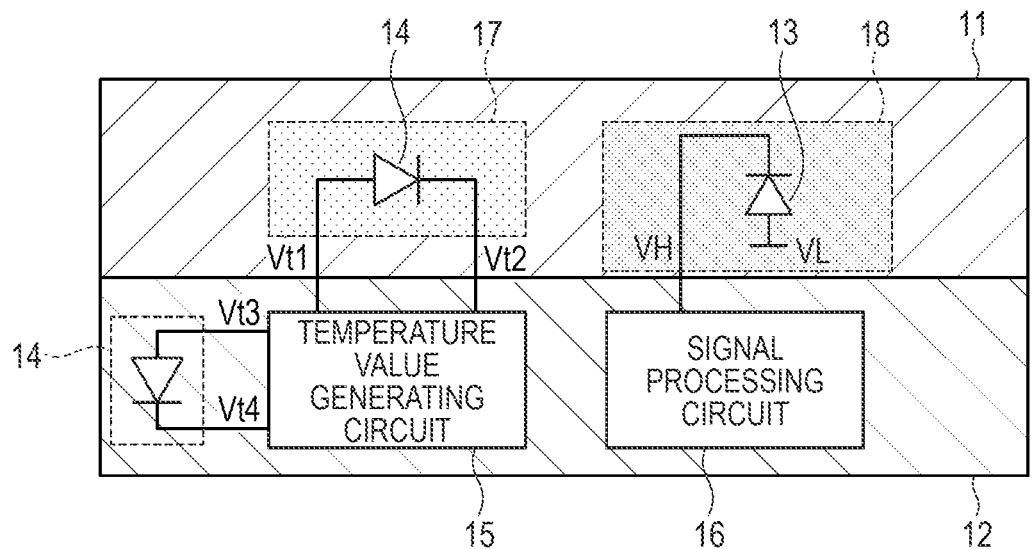
FIG. 9 is a sectional view illustrating a photoelectric conversion apparatus according to a third embodiment of the present invention.

FIG. 9 is a sectional view illustrating a configuration including the first substrate 11 and the second substrate 12 of the photoelectric conversion apparatus 1010 in the present embodiment. As illustrated in FIG. 9, in the present embodiment, unlike the first embodiment, the temperature detection unit 14 is formed and arranged in the first substrate 11, and the temperature detection unit 14 is also formed and arranged in the second substrate 12. The temperature detection unit 14 arranged in the first substrate 11 detects the temperature of the first substrate 11. The temperature detection unit 14 arranged in the second substrate 12 detects the temperature of the second substrate 12.

Note that the temperature detection unit 14 arranged in the first substrate 11 and the temperature detection unit 14 formed in the second substrate 12 may be the same elements or circuits or may be different elements or circuits from each other. For example, the temperature detection unit 14 arranged in the first substrate 11 and the temperature detection unit 14 formed in the second substrate 12 may be the same diodes, or the former may be a diode and the latter may be a ring oscillator.

The temperature detection units 14 arranged in respective substrates of the first substrate 11 and the second substrate 12 each have a separate output terminal. Thus, in the present embodiment, the temperatures of respective substrates of the first substrate 11 and the second substrate 12 can be separately detected by the temperature detection units 14 arranged in respective substrates.

For example, both the temperature detection units 14 arranged in respective substrates of the first substrate 11 and the second substrate 12 may be diodes. In such a case, the temperature of the first substrate 11 is detected from a change in a voltage difference between the anode voltage Vt1 and the cathode voltage Vt2 of the diode that is the temperature detection unit 14 of the first substrate 11. Further, the temperature of the second substrate 12 is detected from a change in a voltage difference between the anode voltage Vt3 and the cathode voltage Vt4 of the diode that is the temperature detection unit 14 of the second substrate 12. Thus, the voltage difference between Vt1 and Vt2 and the voltage difference between Vt3 and Vt4 may differ from each other in association with the temperatures of respective substrates.

The temperature value generating circuit 15 converts output from the temperature detection unit 14 arranged in the first substrate 11 into a temperature value signal, which is a signal indicating temperature information corresponding to the temperature of the first substrate 11, and outputs the temperature value signal. Further, the temperature value generating circuit 15 converts output from the temperature detection unit 14 arranged in the second substrate 12 into a temperature value signal, which is a signal indicating temperature information corresponding to the temperature of the second substrate 12, and outputs the temperature value signal. The temperature value signal corresponding to the temperature of the first substrate 11 and the temperature value signal corresponding to the temperature of the second substrate 12 are input to the compensation circuit 23, respectively.

Figure 10A:
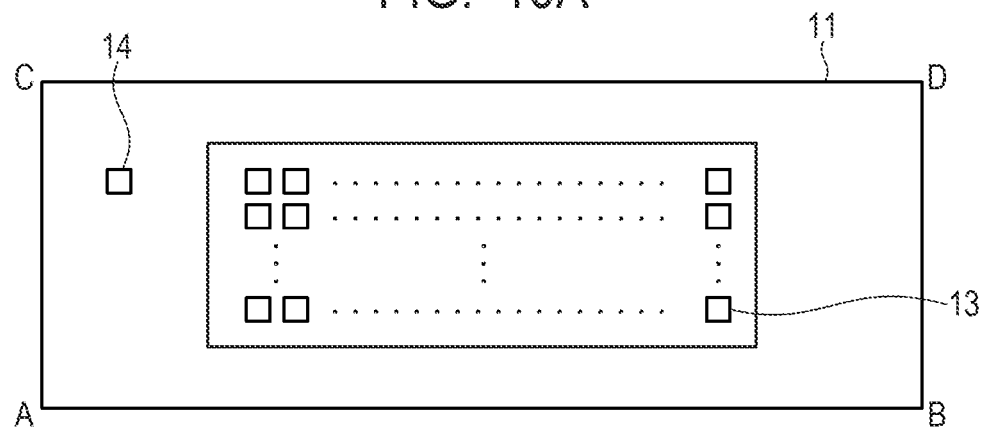
FIG. 10A and FIG. 10B are plan views illustrating the photoelectric conversion apparatus according to the third embodiment of the present invention.

FIG. 10A is a plan view illustrating the first substrate 11 in the photoelectric conversion apparatus 1010 according to the present embodiment. FIG. 10B is a plan view illustrating the second substrate 12 in the photoelectric conversion apparatus 1010 according to the present embodiment. The vertexes A, B, C, and D of the first substrate 11 illustrated in FIG. 10A correspond to the vertexes A, B, C, and D of the second substrate 12 illustrated in FIG. 10B, respectively, to overlap each other.

Figure 10B:
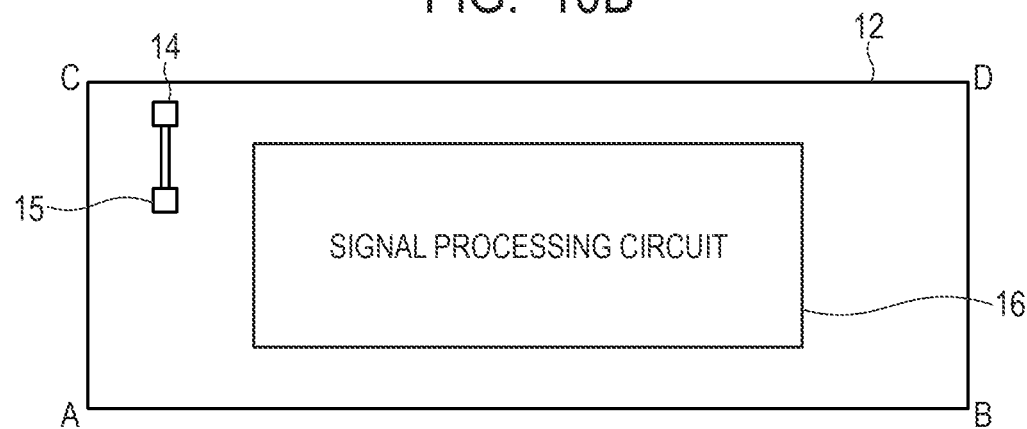

As illustrated in FIG. 10A and FIG. 10B, in the present embodiment, unlike the first embodiment, the temperature detection units 14 are formed and arranged in the second substrate 12 in addition to the first substrate 11.

In the present embodiment, similarly to the first embodiment, the first substrate 11 including the APDs 13 is not required to go through a step of forming MOSFETs. Thus, in the present embodiment, the photoelectric conversion apparatus 1010 can be manufactured by a manufacturing process optimized to the characteristic of the APD 13 compared to the case where the APDs 13 and the temperature value generating circuit 15 are arranged in the same substrate. Therefore, according to the present embodiment, it is possible to easily improve and optimize the characteristic of the APD 13.

Furthermore, in the present embodiment, since the temperature of the second substrate 12 in addition to that of the first substrate 11 can be measured at the same time by the temperature detection units 14 arranged in respective substrates, temperature changes of the first substrate 11 and the second substrate 12 can be compared to each other. In the configuration in which the first substrate 11 and the second substrate 12 are stacked, for example, an increase in power consumption of the signal processing circuit 16 may result in a case where heat generation of the second substrate 12 is larger than heat generation of the first substrate 11 and the temperature of the first substrate 11 changes in response to the temperature change of the second substrate 12. In such a case, based on a temperature value signal corresponding to the temperature of the second substrate 12, the compensation circuit 23 compensates a change in the output characteristic that is in accordance with the temperature change of the APD 13. Therefore, according to the present embodiment, a change in the output characteristic in accordance with a temperature change of the APD 13 can be quickly compensated.

Fourth Embodiment

A photoelectric conversion apparatus according to a fourth embodiment of the present invention will be described with reference to FIG. 11 to FIG. 12B. Note that components similar to those in the photoelectric conversion apparatus according to the above first to third embodiments will be labeled with the same references, and the description thereof will be omitted or simplified.

The photoelectric conversion apparatus in the present embodiment differs from that of the first embodiment in that the photoelectric conversion apparatus has a first component 21 and a second component 22 that are different semiconductor components from each other.

Figure 11:
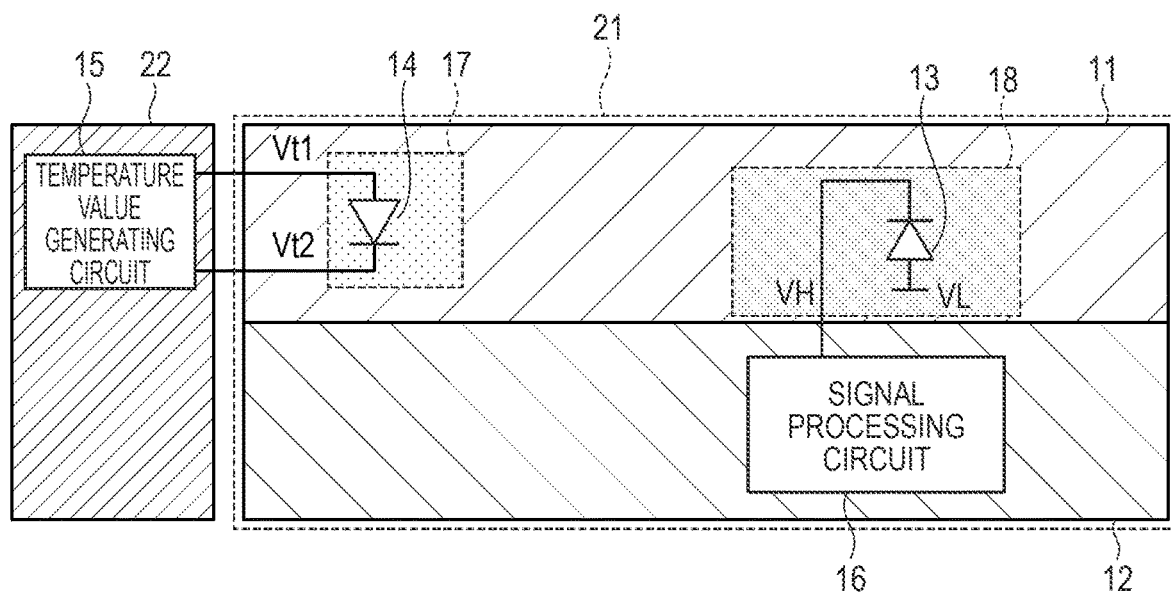
FIG. 11 is a sectional view illustrating a photoelectric conversion apparatus according to a fourth embodiment of the present invention.

FIG. 11 is a sectional view illustrating a configuration including the first component 21 and the second component 22 of the photoelectric conversion apparatus 1010 according to the present embodiment. As illustrated in FIG. 11, the photoelectric conversion apparatus 1010 according to the present embodiment has the first component 21 and the second component 22 that are newly defined. The first component 21 is a semiconductor chip including the first substrate 11 and the second substrate 12. The second component 22 is a semiconductor member that is different from the first component 21.

Further, in the present embodiment, unlike the first embodiment, the temperature value generating circuit 15 is not included in the second substrate 12 but is formed and arranged in the second component 22 outside the first substrate 11. The temperature value generating circuit 15 arranged in the second component 22 is electrically connected to the temperature detection unit 14 arranged in the first substrate 11.

Figure 12A:
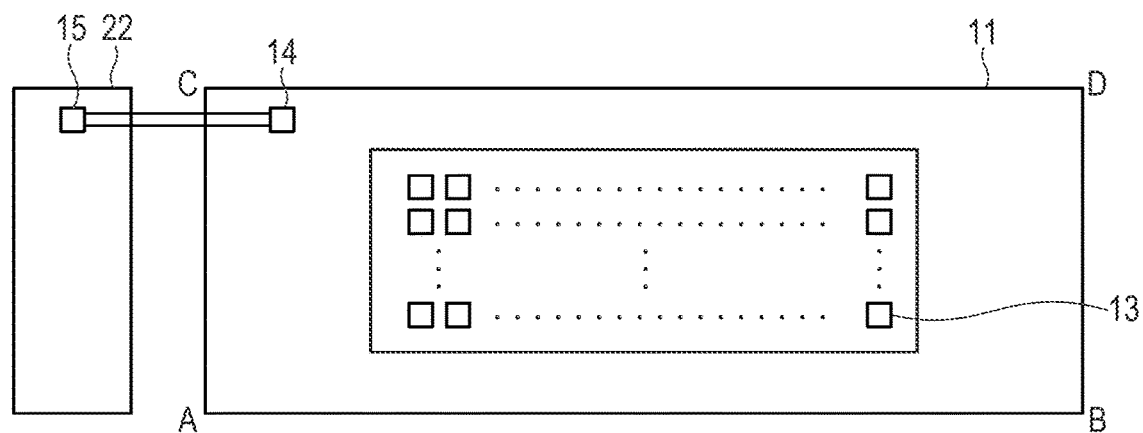
FIG. 12A and FIG. 12B are plan views illustrating the photoelectric conversion apparatus according to the fourth embodiment of the present invention.

FIG. 12A is a plan view illustrating the first substrate 11 and the second component 22 in the photoelectric conversion apparatus 1010 according to the present embodiment. FIG. 12B is a plan view illustrating the second substrate 12 in the photoelectric conversion apparatus 1010 according to the present embodiment. The vertexes A, B, C, and D of the first substrate 11 illustrated in FIG. 12A correspond to the vertexes A, B, C, and D of the second substrate 12 illustrated in FIG. 12B, respectively, to overlap each other.

Figure 12B:
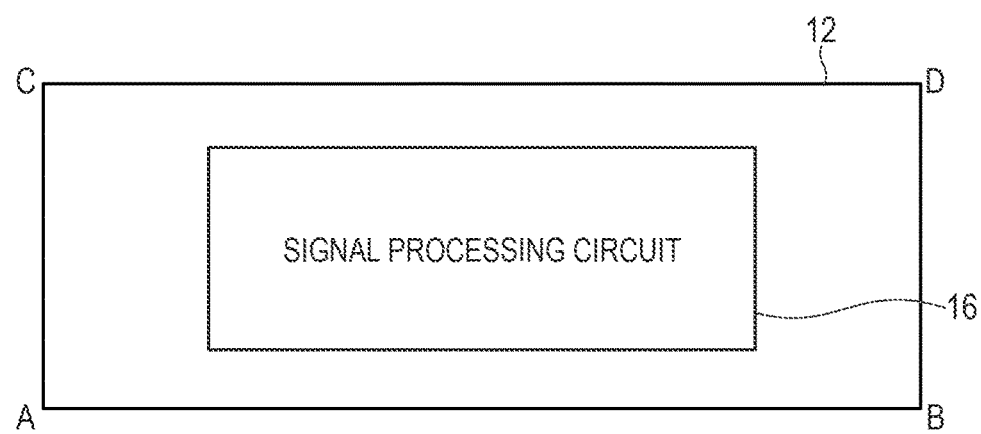

As illustrated in FIG. 12A and FIG. 12B, in the present embodiment, unlike the first embodiment, the temperature value generating circuit 15 is formed and arranged in the second component 22 instead of the second substrate 12.

In the present embodiment, since the temperature value generating circuit 15 is arranged in the second component 22 outside the first substrate 11, similarly to the first embodiment, the first substrate 11 including the APDs 13 is not required to go through a step of forming MOSFETs. Thus, in the present embodiment, the photoelectric conversion apparatus 1010 can be manufactured by a manufacturing process optimized to the characteristic of the APD 13 compared to the case where the APDs 13 and the temperature value generating circuit 15 are arranged in the same substrate. Therefore, according to the present embodiment, it is possible to easily improve and optimize the characteristic of the APD 13.

Furthermore, in the present embodiment, since the temperature value generating circuit 15 is not arranged in the second substrate 12, the number of elements required in the second substrate 12 can be reduced. Therefore, according to the present embodiment, the remaining area in the second substrate 12 can be used for another purpose.

Fifth Embodiment

A photoelectric conversion apparatus according to a fifth embodiment of the present invention will be described with reference to FIG. 13 to FIG. 14B. Note that components similar to those in the photoelectric conversion apparatus according to the above first to fourth embodiments will be labeled with the same references, and the description thereof will be omitted or simplified.

The photoelectric conversion apparatus in the present embodiment differs from that of the second embodiment in that the photoelectric conversion apparatus has a first component 21 and a second component 22 that are different semiconductor chips from each other.

Figure 13:
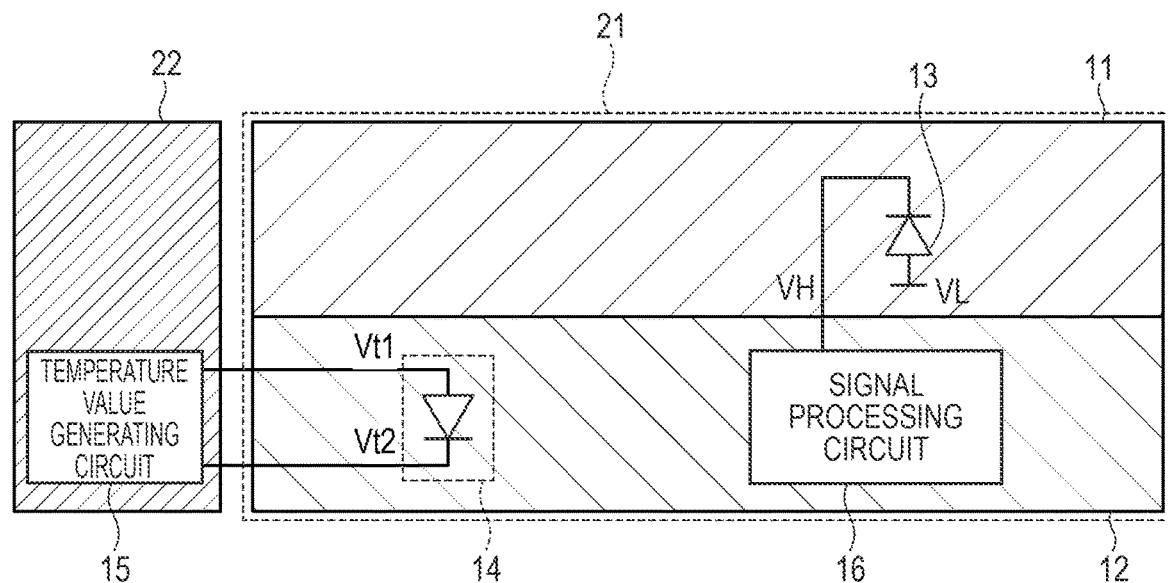
FIG. 13 is a sectional view illustrating a photoelectric conversion apparatus according to a fifth embodiment of the present invention.

FIG. 13 is a sectional view illustrating a configuration including the first component 21 and the second component 22 of the photoelectric conversion apparatus 1010 according to the present embodiment. As illustrated in FIG. 13, the photoelectric conversion apparatus 1010 according to the present embodiment has the first component 21 and the second component 22 that are newly defined. The first component 21 is a semiconductor chip including the first substrate 11 and the second substrate 12. The second component 22 is a semiconductor member that is different from the first component 21.

Further, in the present embodiment, unlike the first embodiment, the temperature value generating circuit 15 is not included in the second substrate 12 but is formed and arranged in the second component 22 outside the first substrate 11. The temperature value generating circuit 15 arranged in the second component 22 is electrically connected to the temperature detection unit 14 arranged in the second substrate 12.

Figure 14A:
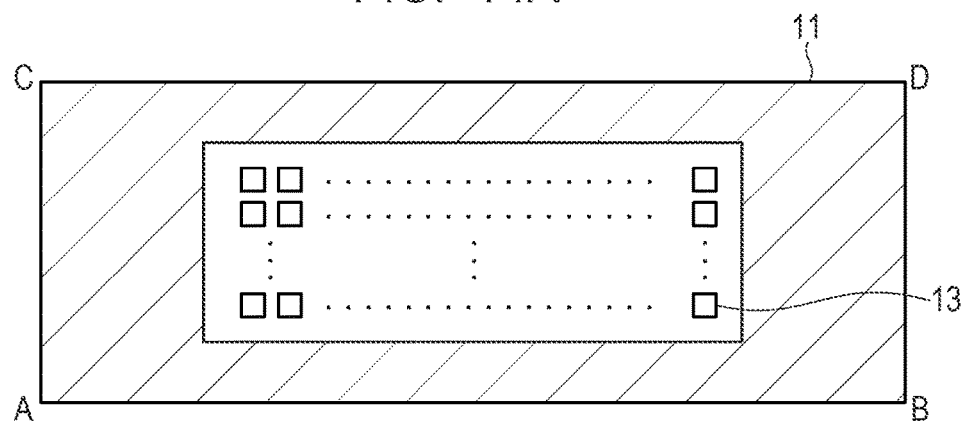
FIG. 14A and FIG. 14B are plan views illustrating the photoelectric conversion apparatus according to the fifth embodiment of the present invention.

FIG. 14A is a plan view illustrating the first substrate 11 in the photoelectric conversion apparatus 1010 according to the present embodiment. FIG. 14B is a plan view illustrating the second substrate 12 and the second component 22 in the photoelectric conversion apparatus 1010 according to the present embodiment. The vertexes A, B, C, and D of the first substrate 11 illustrated in FIG. 14A correspond to the vertexes A, B, C, and D of the second substrate 12 illustrated in FIG. 14B, respectively, to overlap each other.

Figure 14B:
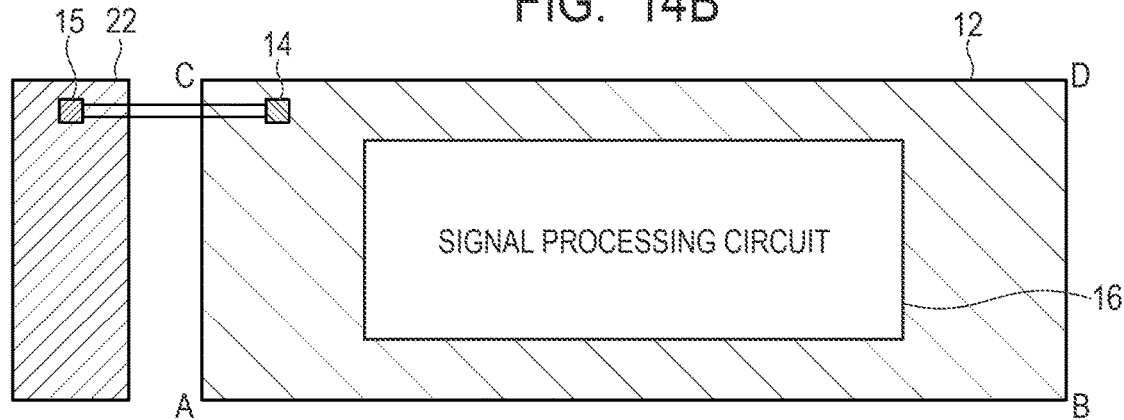

As illustrated in FIG. 14A and FIG. 14B, in the present embodiment, unlike the first embodiment, the temperature value generating circuit 15 is formed and arranged in the second component 22 instead of the second substrate 12.

In the present embodiment, since the temperature value generating circuit 15 is arranged in the second component 22 outside the first substrate 11, similarly to the second embodiment, the first substrate 11 including the APDs 13 is not required to go through a step of forming MOSFETs. Thus, in the present embodiment, the photoelectric conversion apparatus 1010 can be manufactured by a manufacturing process optimized to the characteristic of the APD 13 compared to the case where the APDs 13 and the temperature value generating circuit 15 are arranged in the same substrate. Therefore, according to the present embodiment, it is possible to easily improve and optimize the characteristic of the APD 13.

Furthermore, in the present embodiment, since the temperature value generating circuit 15 is not arranged in the second substrate 12, the number of elements required in the second substrate 12 can be reduced. Therefore, according to the present embodiment, the remaining area in the second substrate 12 can be used for another purpose.

Sixth Embodiment

A photoelectric conversion apparatus according to a sixth embodiment of the present invention will be described with reference to FIG. 15A and FIG. 15B. Note that components similar to those in the photoelectric conversion apparatus according to the above first to fifth embodiments will be labeled with the same references, and the description thereof will be omitted or simplified.

The photoelectric conversion apparatus according to the present embodiment differs from that of the first embodiment in that the photoelectric conversion apparatus includes a plurality of temperature detection units 14 and a plurality of temperature value generating circuits 15.

Figure 15A:
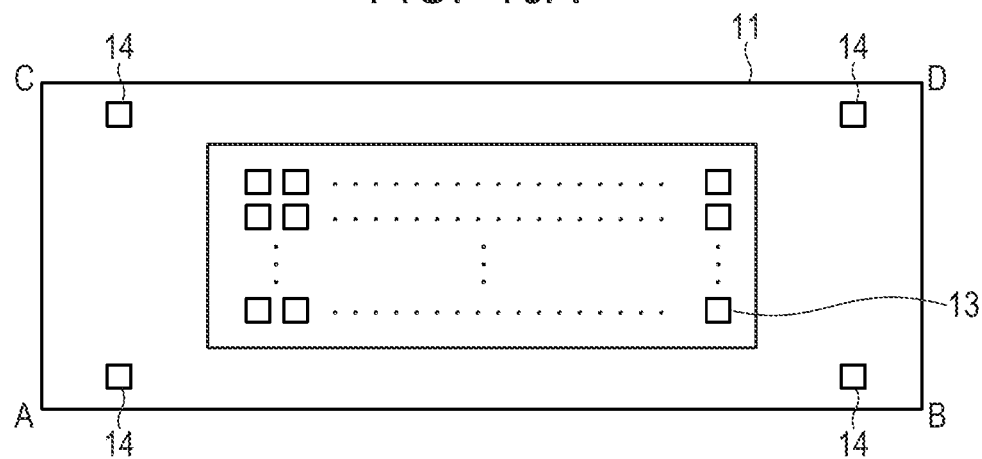
FIG. 15A and FIG. 15B are plan views illustrating a photoelectric conversion apparatus according to a sixth embodiment of the present invention.

FIG. 15A is a plan view illustrating the first substrate 11 in the photoelectric conversion apparatus 1010 according to the present embodiment. FIG. 15B is a plan view illustrating the second substrate 12 in the photoelectric conversion apparatus 1010 according to the present embodiment. The vertexes A, B, C, and D of the first substrate 11 illustrated in FIG. 15A correspond to the vertexes A, B, C, and D of the second substrate 12 illustrated in FIG. 15B, respectively, to overlap each other.

Figure 15B:
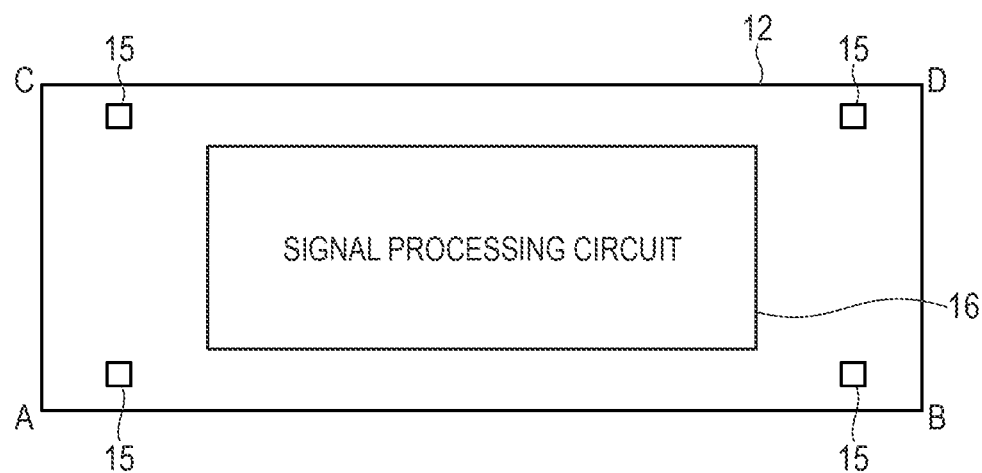

As illustrated in FIG. 15A and FIG. 15B, in the present embodiment, unlike the first embodiment, a plurality of temperature detection units 14 and a plurality of temperature value generating circuits 15 are arranged at a plurality of positions on a plane, respectively. That is, the plurality of temperature detection units 14 are formed and arranged in the first substrate 11. The plurality of temperature detection units 14 are distributed and arranged at different positions on a plane of the first substrate 11. The plurality of temperature value generating circuits 15 are formed and arranged in association with the plurality of temperature detection units 14 on the second substrate 12. Each of the temperature detection units 14 is electrically connected to a corresponding temperature value generating circuit 15. Note that the temperature value generating circuits 15 may be distributed and arranged at different positions on the plane of the second substrate 12 as illustrated in FIG. 15B or may be arranged adjacent to each other at one position on the plane.

Temperature value signals are input to the compensation circuit 23 from the plurality of temperature value generating circuits 15. Accordingly, the compensation circuit 23 can acquire a plurality of temperature value signals from the plurality of temperature detection units 14, that is, an in-substrate temperature distribution of the first substrate 11. The compensation circuit 23 can compensate a change in the output characteristic, which is in accordance with temperature changes of the APDs 13, based on the acquired in-substrate temperature distribution of the first substrate 11.

For example, the compensation circuit 23 can compensate a change in the output characteristic, which is in accordance with temperature changes of the APDs 13, based on a representative value of the plurality of temperature value signals from the plurality of temperature detection units 14, that is, a representative value of the plurality of temperatures in the in-substrate temperature distribution of the first substrate 11. Further, for example, the compensation circuit 23 can compensate a change in the output characteristic, which is in accordance with temperature changes of the APDs 13, based on a result obtained by performing calculation such as averaging for a plurality of temperatures indicated by the plurality of temperature value signals from the plurality of temperature detection units 14 or the like. At this time, the compensation circuit 23 can perform temperature compensation collectively for the APDs 13 formed on the first substrate 11 or can perform temperature compensation on a divided region basis in accordance with the position information in the in-substrate temperature distribution.

As described above, according to the present embodiment, since a change in the output characteristic in accordance with temperature changes of the APDs 13 can be compensated based on an in-substrate temperature distribution of the first substrate 11, fine temperature compensation can be realized.

Seventh Embodiment

A photoelectric conversion apparatus according to a seventh embodiment of the present invention will be described with reference to FIG. 16A and FIG. 16B. Note that components similar to those in the photoelectric conversion apparatus according to the above first to sixth embodiments will be labeled with the same references, and the description thereof will be omitted or simplified.

The photoelectric conversion apparatus according to the present embodiment differs from that of the second embodiment in that the photoelectric conversion apparatus includes a plurality of temperature detection units 14 and a plurality of temperature value generating circuits 15.

Figure 16A:
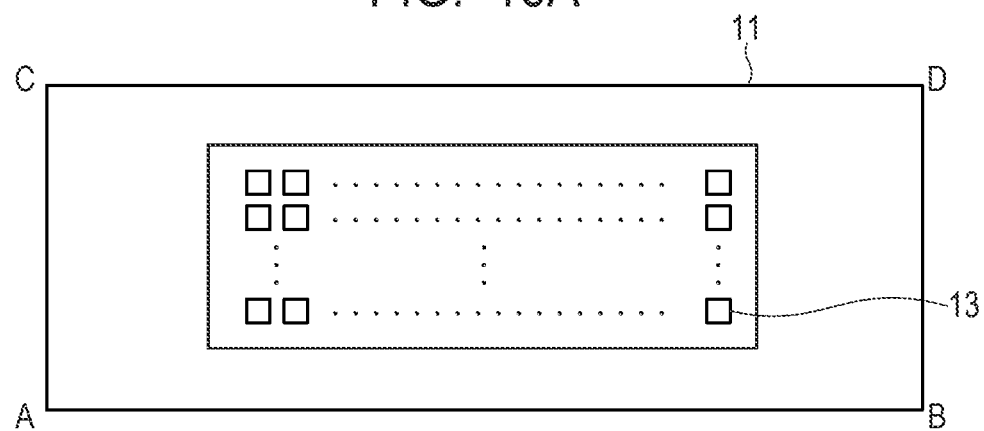
FIG. 16A and FIG. 16B are plan views illustrating a photoelectric conversion apparatus according to a seventh embodiment of the present invention.

FIG. 16A is a plan view illustrating the first substrate 11 in the photoelectric conversion apparatus 1010 according to the present embodiment. FIG. 16B is a plan view illustrating the second substrate 12 in the photoelectric conversion apparatus 1010 according to the present embodiment. The vertexes A, B, C, and D of the first substrate 11 illustrated in FIG. 16A correspond to the vertexes A, B, C, and D of the second substrate 12 illustrated in FIG. 16B, respectively, to overlap each other.

Figure 16B:
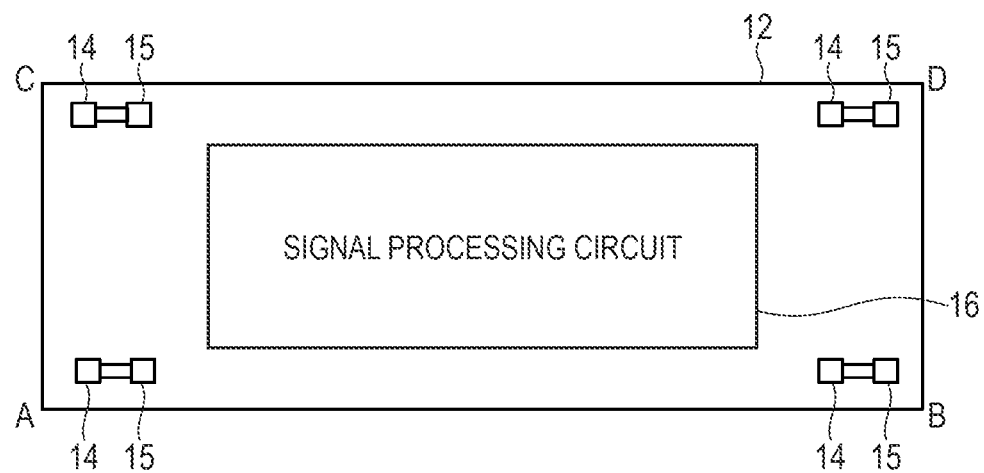

As illustrated in FIG. 16A and FIG. 16B, in the present embodiment, unlike the second embodiment, a plurality of temperature detection units 14 and a plurality of temperature value generating circuits 15 are arranged at a plurality of positions on a plane, respectively. That is, the plurality of temperature detection units 14 are formed and arranged on the second substrate 12. The plurality of temperature detection units 14 are distributed and arranged at different positions on a plane of the second substrate 12. The plurality of temperature value generating circuits 15 are formed and arranged in association with the plurality of temperature detection units 14 on the second substrate 12. Each of the temperature detection units 14 is electrically connected to a corresponding temperature value generating circuit 15. Note that, similarly to the temperature detection units 14, the temperature value generating circuits 15 may be distributed and arranged at different positions on the plane of the second substrate 12 as illustrated in FIG. 16B or may be arranged adjacent to each other at one position on the plane.

Temperature value signals are input to the compensation circuit 23 from the plurality of temperature value generating circuits 15. Accordingly, the compensation circuit 23 can acquire a plurality of temperature value signals from the plurality of temperature detection units 14, that is, an in-substrate temperature distribution of the second substrate 12. The compensation circuit 23 can compensate a change in the output characteristic, which is in accordance with temperature changes of the APDs 13, based on the acquired in-substrate temperature distribution of the second substrate 12.

For example, the compensation circuit 23 can compensate a change in the output characteristic, which is in accordance with temperature changes of the APDs 13, based on a representative value of the plurality of temperature value signals from the plurality of temperature detection units 14, that is, a representative value of the plurality of temperatures in the in-substrate temperature distribution of the second substrate 12. Further, for example, the compensation circuit 23 can compensate a change in the output characteristic, which is in accordance with temperature changes of the APDs 13, based on a result obtained by performing calculation such as averaging for a plurality of temperatures indicated by the plurality of temperature value signals from the plurality of temperature detection units 14 or the like. At this time, the compensation circuit 23 can perform temperature compensation collectively for the APDs 13 formed on the first substrate 11 or can perform temperature compensation on a divided region basis in accordance with the position information in the in-substrate temperature distribution.

As described above, according to the present embodiment, since a change in the output characteristic in accordance with temperature changes of the APDs 13 can be compensated based on an in-substrate temperature distribution of the second substrate 12, fine temperature compensation can be realized.

Eighth Embodiment

A photoelectric conversion apparatus according to an eighth embodiment of the present invention will be described with reference to FIG. 17A and FIG. 17B. Note that components similar to those in the photoelectric conversion apparatus according to the above first to seventh embodiments will be labeled with the same references, and the description thereof will be omitted or simplified.

The photoelectric conversion apparatus according to the present embodiment differs from that of the fourth embodiment in that the photoelectric conversion apparatus includes a plurality of temperature detection units 14 and a plurality of temperature value generating circuits 15.

Figure 17A:
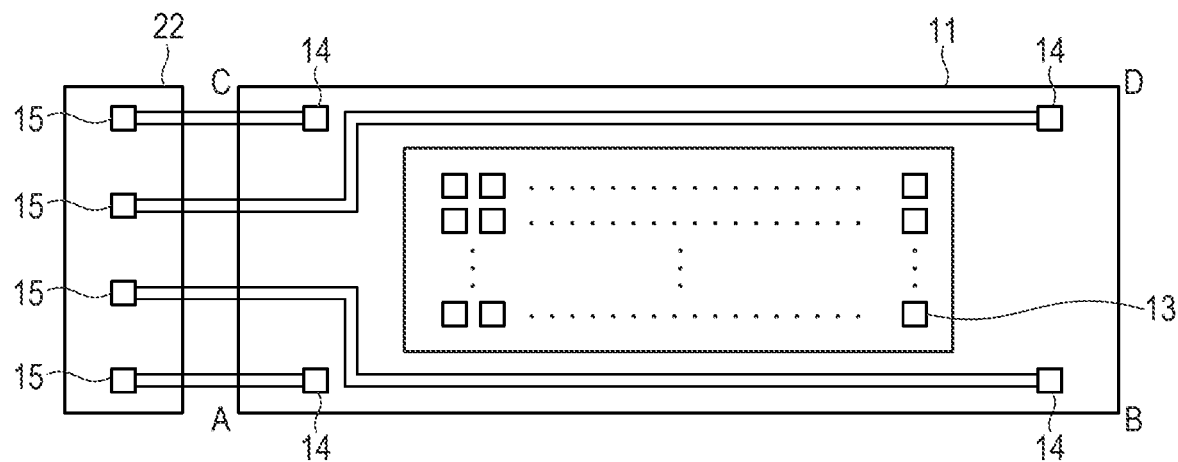
FIG. 17A and FIG. 17B are plan views illustrating a photoelectric conversion apparatus according to an eighth embodiment of the present invention.

FIG. 17A is a plan view illustrating the first substrate 11 and the second component 22 in the photoelectric conversion apparatus 1010 according to the present embodiment. FIG. 17B is a plan view illustrating the second substrate 12 in the photoelectric conversion apparatus 1010 according to the present embodiment. The vertexes A, B, C, and D of the first substrate 11 illustrated in FIG. 17A correspond to the vertexes A, B, C, and D of the second substrate 12 illustrated in FIG. 17B, respectively, to overlap each other.

Figure 17B:
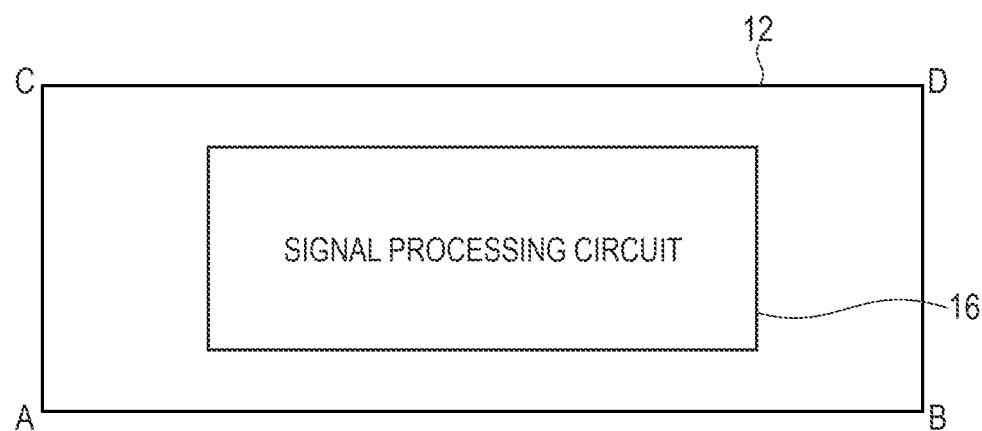

As illustrated in FIG. 17A and FIG. 17B, in the present embodiment, unlike the fourth embodiment, a plurality of temperature detection units 14 and a plurality of temperature value generating circuits 15 are arranged at a plurality of positions on a plane, respectively. That is, the plurality of temperature detection units 14 are formed and arranged on the first substrate 11. The plurality of temperature detection units 14 are distributed and arranged at different positions on a plane of the first substrate 11. The plurality of temperature value generating circuits 15 are formed and arranged in association with the plurality of temperature detection units 14 in the second component 22. Each of the temperature detection units 14 is electrically connected to a corresponding temperature value generating circuit 15. Note that the temperature value generating circuits 15 may be distributed and arranged at different positions on the plane of the second component 22 as illustrated in FIG. 17A or may be arranged adjacent to each other at one position on the plane.

Temperature value signals are input to the compensation circuit 23 from the plurality of temperature value generating circuits 15. Accordingly, the compensation circuit 23 can acquire an in-substrate temperature distribution of the first substrate 11. The compensation circuit 23 can compensate a change in the output characteristic, which is in accordance with temperature changes of the APDs 13, based on the acquired in-substrate temperature distribution of the first substrate 11. For example, the compensation circuit 23 can compensate a change in the output characteristic, which is in accordance with temperature changes of the APDs 13, based on a representative value of a plurality of temperatures in the in-substrate temperature distribution of the first substrate 11, a result obtained by performing calculation such as averaging for a plurality of temperatures, or the like. At this time, the compensation circuit 23 can perform temperature compensation collectively for the APDs 13 formed on the first substrate 11 or can perform temperature compensation on a divided region basis in accordance with the position information in the in-substrate temperature distribution.

Temperature value signals are input to the compensation circuit 23 from the plurality of temperature value generating circuits 15. Accordingly, the compensation circuit 23 can acquire a plurality of temperature value signals from the plurality of temperature detection units 14, that is, an in-substrate temperature distribution of the first substrate 11. The compensation circuit 23 can compensate a change in the output characteristic, which is in accordance with temperature changes of the APDs 13, based on the acquired in-substrate temperature distribution of the first substrate 11.

For example, the compensation circuit 23 can compensate a change in the output characteristic, which is in accordance with temperature changes of the APDs 13, based on a representative value of the plurality of temperature value signals from the plurality of temperature detection units 14, that is, a representative value of the plurality of temperatures in the in-substrate temperature distribution of the first substrate 11. Further, for example, the compensation circuit 23 can compensate a change in the output characteristic, which is in accordance with temperature changes of the APDs 13, based on a result obtained by performing calculation such as averaging for a plurality of temperatures indicated by the plurality of temperature value signals from the plurality of temperature detection units 14 or the like. At this time, the compensation circuit 23 can perform temperature compensation collectively for the APDs 13 formed on the first substrate 11 or can perform temperature compensation on a divided region basis in accordance with the position information in the in-substrate temperature distribution.

As described above, according to the present embodiment, since a change in the output characteristic in accordance with temperature changes of the APDs 13 can be compensated based on an in-substrate temperature distribution of the first substrate 11, fine temperature compensation can be realized.

Note that, although the case where the inclusion of a plurality of temperature detection units 14 and a plurality of temperature value generating circuits 15 makes a difference from the fourth embodiment has been described in the present embodiment, the embodiment can be configured such that the inclusion of a plurality of temperature detection units 14 and a plurality of temperature value generating circuits 15 makes a difference from the fifth embodiment.

Ninth Embodiment

Figure 18:
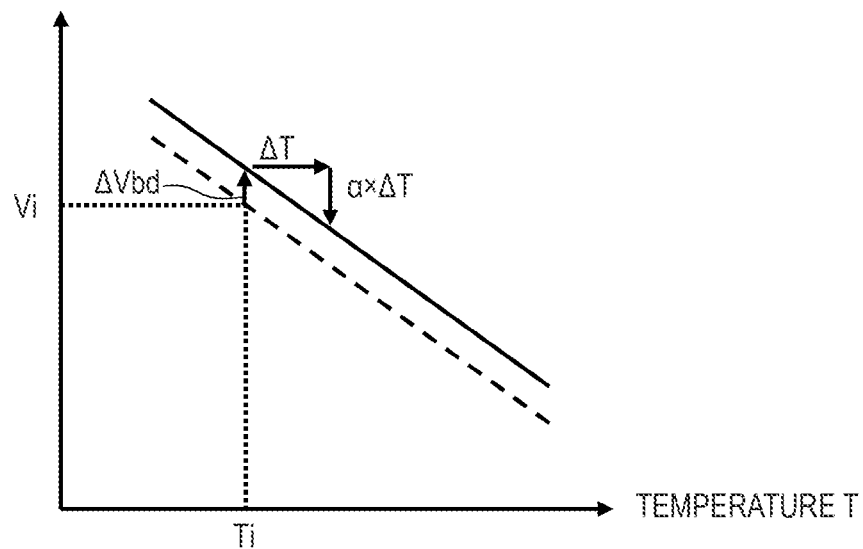
FIG. 18 illustrates a characteristic of power source voltage control of an avalanche photodiode according to a compensation circuit in a ninth embodiment of the present invention.

A temperature compensation method according to a ninth embodiment of the present invention will be described with reference to FIG. 18. FIG. 18 illustrates the characteristic of power source voltage control of an avalanche photodiode performed by the compensation circuit 23 in the present embodiment.

In FIG. 18, the horizontal axis represents temperature T that is the temperature value calculated by the temperature value generating circuit 15, and the vertical axis represents the power source voltage VL of the APD 13. It is possible to compensate the output characteristic, which is in accordance with a temperature change of the APD 13, by controlling the power source voltage VL by using the compensation circuit 23 when the temperature T indicated by the temperature value generating circuit 15 changes. First, a reference temperature for temperature compensation is denoted as Ti, and the ideal power source voltage value for the power source voltage VL of the APD 13 is denoted as Vi. Herein, since the values of the breakdown voltages of the APDs 13 may vary individually with respect to the ideal power source voltage value Vi at the reference temperature Ti, it is required to consider that the actual voltage value V provided to the power source voltage VL has a breakdown voltage shift ΔVbd as an offset relative to the ideal power source voltage value Vi. That is, the value of the power source voltage VL at the reference temperature Ti is controlled with Vi+ΔVbd. At this time, ΔVbd that is a shift of an individual value from an ideal value of the breakdown voltage may take a positive value, a negative value, or even a value of 0 in accordance with on individuals.

Further, when a temperature change relative to the reference temperature Ti is denoted as ΔT, the compensation amount (value) of the power source voltage VL per unit temperature is denoted as α. That is, the power source voltage VL of the APD 13 is controlled with:

$$VL = \alpha \times \Delta T + Vi + \Delta Vbd.$$

With such control, it is possible to realize temperature compensation of the power source voltage VL while taking into consideration of the individual variation ΔVbd of the breakdown voltages of the APDs 13. At this time, the individual variation ΔVbd may be obtained by averaging individual variations of a plurality of avalanche photodiodes or may be a value for a single avalanche photodiode.

Further, when such power source voltage control is performed, the temperature T calculated by the temperature value generating circuit 15 may be a value obtained by taking individual values of the temperature detection units 14 into consideration. The individual value of the temperature detection unit 14 is a characteristic value of each individual for a voltage value, a current value, or an oscillation frequency as output from the temperature detection unit 14. For example, when each temperature detection unit 14 is a diode, variations of voltage values on an individual basis when constant current is caused to flow in the diodes may be taken into consideration and reflected to the temperature calculation process of the temperature value generating circuit 15. With individual values of the temperature detection units 14 being taken into consideration as described above, a temperature value signal may be more accurately transferred to the compensation circuit 23, and accurate temperature compensation of the power source voltage VL may be possible.

Tenth Embodiment

A temperature compensation method according to a tenth embodiment of the present invention will be described with reference to FIG. 19. A difference from the temperature compensation according to the above ninth embodiment is in that temperature compensation of the power source voltage VL differs in accordance with the range of the temperature T.

Figure 19:
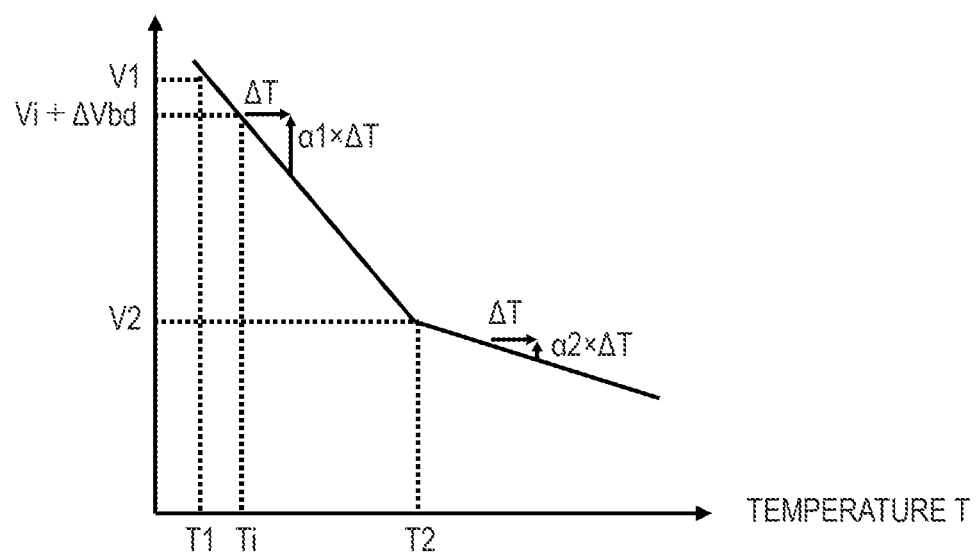
FIG. 19 illustrates a characteristic of power source voltage control of an avalanche photodiode according to a compensation circuit in a tenth embodiment of the present invention.

A first temperature range is defined between a first temperature T1 and a second temperature T2 illustrated in FIG. 19. Further, a temperature higher than the second temperature T2 is defined as a second temperature range, as a temperature range outside the first temperature range. The amount of power source voltage compensation per unit temperature for temperature change ΔT in the first temperature range is denoted as α1, and the amount of power source voltage compensation per unit temperature for temperature change ΔT in the second temperature range is denoted as α2. Herein, α2 is less than α1. Further, the reference temperature Ti is included in the first temperature range.

The power source voltage VL in the first temperature range is expressed by VL=α1×ΔT+Vi+ΔVbd. The power source voltage VL in the second temperature range can be expressed by VL=α2×ΔT+V2. Herein, V2 is the power source voltage VL at the second temperature T2 and can be expressed by V2=α1×(T2−Ti)+Vi+ΔVbd.

As described above, with a reduced amount of power source voltage compensation per unit temperature in the second temperature range that is higher than the first temperature range, a further increase in power consumption can be suppressed when the temperature rises due to an increase in the drive frequency of the APD 13 and the signal processing circuit 16 at high illuminance. When temperature compensation of the power source voltage VL involved by a temperature change is performed, the bias voltage between the VH and VL of the APD 13 with respect to a rise in temperature increases, the rise of the bias voltage leads to an additional rise in temperature involved by an increase in power consumption, and therefore, positive feedback may continue to be applied at high illuminance. If the power consumption or the temperature continues to rise, this may cause a concern about generating device destruction due to an operation exceeding the guarantee range of the device. In suppressing this, the present embodiment can be used with an advantage in terms of reliability.

Further, α2 may be less than α1 or may be even a value of 0.

Eleventh Embodiment

Figure 20:
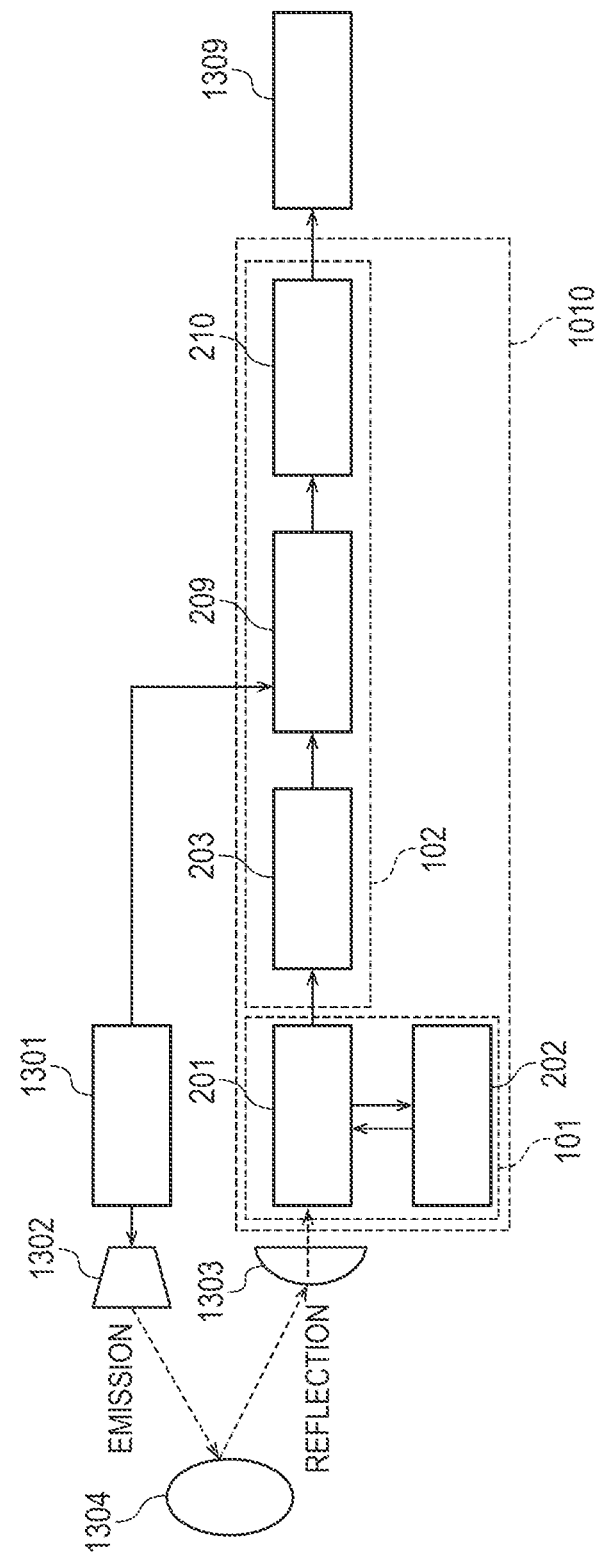
FIG. 20 is a block diagram illustrating a configuration example of a photo-detection system according to an eleventh embodiment of the present invention.

A photo-detection system according to an eleventh embodiment of the present invention will be described with reference to FIG. 20. FIG. 20 is a block diagram illustrating a configuration example of the photo-detection system according to the present embodiment.

In the present embodiment, an example of a photo-detection system using the photoelectric conversion apparatus 1010 according to the first to eighth embodiments will be described with reference to FIG. 20. Elements having functions similar to those in FIG. 1 to FIG. 17B are labeled with similar references, and the description thereof will be omitted or simplified.

First, a distance detection system that is an example of the photo-detection system will be described with reference to FIG. 20. Note that the pixel 100 of the present embodiment has a TDC 209 and a memory 210 instead of the counter circuit 204 of FIG. 2.

FIG. 20 is a block diagram of the distance detection system. The distance detection system has a light source control unit 1301, a light-emitting unit 1302, an optical member 1303, a photoelectric conversion apparatus 1010, and a distance calculation unit 1309.

The light source control unit 1301 controls driving of the light-emitting unit 1302. The light-emitting unit 1302 is a light-emitting device that emits light of short pulses (sequence) in an image capturing direction in response to a signal from the light source control unit 1301.

The light emitted from the light-emitting unit 1302 is reflected by an object 1304. The reflected light is received by the photoelectric conversion portion 201 of the photoelectric conversion apparatus 1010 through the optical member 1303 such as a lens. The photoelectric conversion portion 201 outputs a signal based on incident light, and this signal is input to the TDC 209 via the waveform shaper 203 that is an inverter circuit.

The TDC 209 acquires a signal indicating a timing of light emission from the light-emitting unit 1302 from the light source control unit 1301. The TDC 209 compares a signal acquired from the light source control unit 1301 with a signal input from the waveform shaper 203. Accordingly, the TDC 209 outputs, as a digital signal, a time period from the time the light-emitting unit 1302 emits pulse light to the time the reflected light reflected by the object 1304 is received. The digital signal output from the TDC 209 is held in the memory 210. This process is repeatedly performed for multiple times, and the memory 210 can hold digital signals for multiple times.

The distance calculation unit 1309 calculates the distance from the photoelectric conversion apparatus 1010 to the object 1304 based on the plurality of digital signals held in the memory 210. This distance detection system can be applied to an on-vehicle distance detection device, for example. Note that, since the process performed in the distance calculation unit 1309 is a process of digital signals, the distance calculation unit may also be referred to as a signal processing unit in a more general sense.

Twelfth Embodiment

Figure 21A:
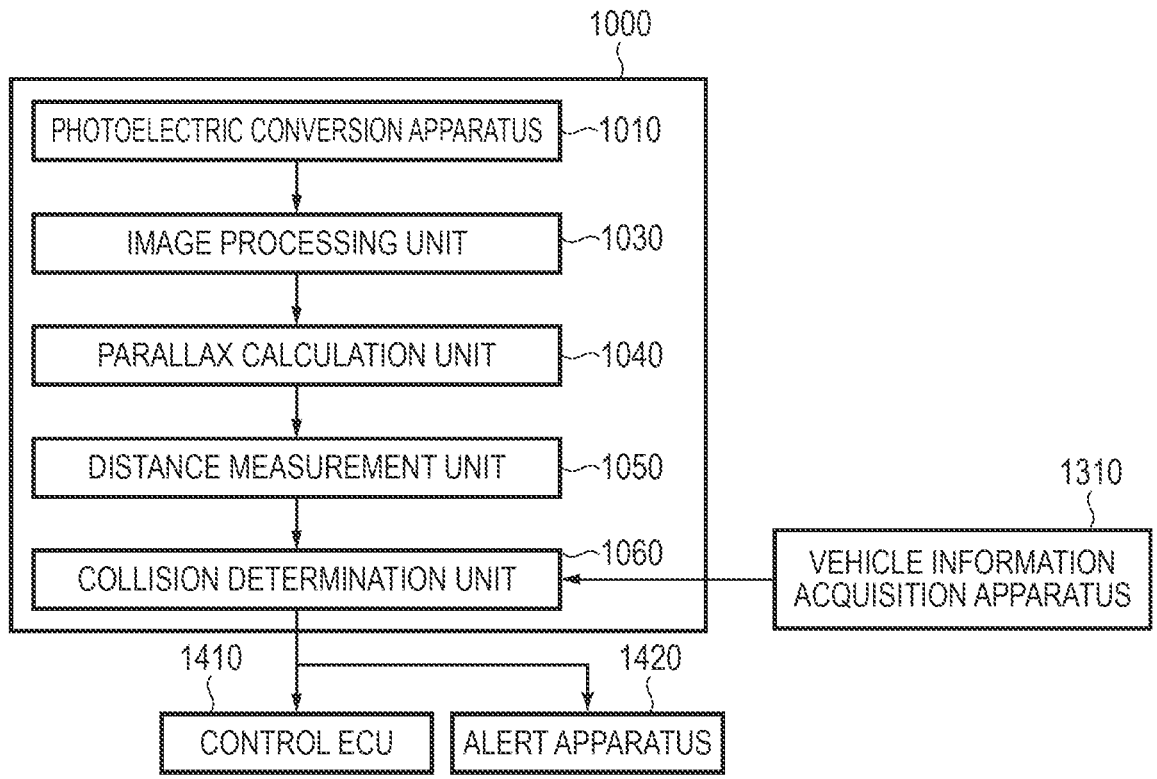
FIG. 21A and FIG. 21B are diagrams illustrating a configuration example of a photo-detection system and a movable body according to a twelfth embodiment of the present invention.
Figure 21B:
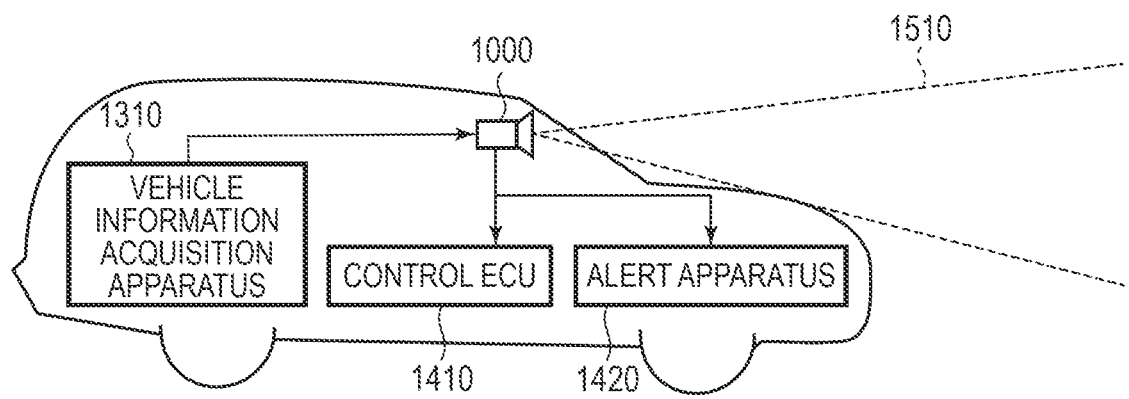

An imaging system and a movable body according to a twelfth embodiment of the present invention will be described with reference to FIG. 21A and FIG. 21B. FIG. 21A and FIG. 21B are diagrams illustrating a configuration of a photo-detection system 1000 and the movable body according to the present embodiment.

FIG. 21A is a block diagram illustrating an example of the photo-detection system 1000 related to an on-vehicle camera. The photo-detection system 1000 has the photoelectric conversion apparatus 1010 according to the first embodiment. The photo-detection system 1000 has an image processing unit 1030 that performs image processing on a plurality of digital signals acquired by the photoelectric conversion apparatus 1010. Furthermore, the photo-detection system 1000 has a parallax calculation unit 1040 that calculates a parallax (phase difference of parallax images) from a plurality of image data acquired by the image processing unit 1030.

Further, the photo-detection system 1000 has a distance measurement unit 1050 that calculates the distance to an object based on a calculated parallax and a collision determination unit 1060 that determines whether or not there is a collision possibility based on the calculated distance. Herein, the parallax calculation unit 1040 and the distance measurement unit 1050 are an example of a distance information acquisition unit that acquires distance information on a distance to an object. That is, the distance information is information related to a parallax, a defocus amount, a distance to an object, or the like.

The collision determination unit 1060 may determine the collision possibility by using any of these pieces of distance information. The distance information acquisition unit may be implemented by dedicatedly designed hardware, may be implemented by a software module, or may be implemented by a combination thereof. Further, the distance information acquisition unit may be implemented by a field programmable gate array (FPGA), an application specific integrated circuit (ASIC), or the like. Furthermore, the distance information acquisition unit may be implemented by a combination thereof.

The photo-detection system 1000 is connected to a vehicle information acquisition apparatus 1310 and can acquire vehicle information such as a vehicle speed, a yaw rate, a steering angle, or the like. Further, the photo-detection system 1000 is connected to a control ECU 1410 that is a control device that outputs a control signal to cause the vehicle to generate braking force based on a determination result from the collision determination unit 1060.

Further, the photo-detection system 1000 is connected also to an alert apparatus 1420 that issues an alert to a driver based on a determination result from the collision determination unit 1060. For example, when the determination result from the collision determination unit 1060 indicates a high collision possibility, the control ECU 1410 performs vehicle control to avoid collision or reduce damage by applying a brake, releasing an accelerator, suppressing engine output, or the like. The alert apparatus 1420 warns the user by sounding an alarm such as a sound, displaying alarm information on a screen of a car navigation system or the like, vibrating a seatbelt or a steering wheel, or the like.

In the present embodiment, an area around a vehicle, for example, a front area or a rear area is captured by using the photo-detection system 1000. FIG. 21B illustrates the photo-detection system 1000 when the front area of the vehicle (a capturing area 1510) is captured. The vehicle information acquisition apparatus 1310 transmits an instruction to instruct the photo-detection system 1000 or the photoelectric conversion apparatus 1010 to perform a predetermined operation. Such a configuration can further improve the ranging accuracy. The vehicle may have a control unit that controls a vehicle, which is a movable body, based on distance information.

Although the example of control for avoiding a collision to another vehicle has been described above, the photo-detection system 1000 is applicable to automatic driving control for following another vehicle, automatic driving control for not going out of a traffic lane, or the like. Furthermore, the photo-detection system 1000 is not limited to a vehicle and can be applied to a movable body (moving apparatus) such as a ship, an airplane, or an industrial robot, for example. In addition, the photo-detection system 1000 can be widely applied to an equipment which utilizes object recognition, such as an intelligent transportation system (ITS), without being limited to movable bodies.

According to the present embodiment, with the use of the photoelectric conversion apparatus 1010 having improved detection performance, a photo-detection system and a movable body having higher performance can be provided.

Modified Embodiments

The present invention is not limited to the embodiments described above, and various modifications are possible. For example, an example in which a part of the configuration of any of the embodiments is added to another embodiment or an example in which a part of the configuration of any of the embodiments is replaced with a part of the configuration of another embodiment is also one of the embodiments of the present invention.

According to the present invention, in a photoelectric conversion apparatus that acquires a value corresponding to the temperature of an APD, it is possible to easily optimize the characteristic of the APD.

Embodiments of the present invention can also be realized by a computer of a system or apparatus that reads out and executes computer executable instructions (e.g., one or more programs) recorded on a storage medium (which may also be referred to more fully as a 'non-transitory computer-readable storage medium') to perform the functions of one or more of the above-described embodiments and/or that includes one or more circuits (e.g., application specific integrated circuit (ASIC)) for performing the functions of one or more of the above-described embodiments, and by a method performed by the computer of the system or apparatus by, for example, reading out and executing the computer executable instructions from the storage medium to perform the functions of one or more of the above-described embodiments and/or controlling the one or more circuits to perform the functions of one or more of the above-described embodiments. The computer may comprise one or more processors (e.g., central processing unit (CPU), micro processing unit (MPU)) and may include a network of separate computers or separate processors to read out and execute the computer executable instructions. The computer executable instructions may be provided to the computer, for example, from a network or the storage medium. The storage medium may include, for example, one or more of a hard disk, a random-access memory (RAM), a read only memory (ROM), a storage of distributed computing systems, an optical disk (such as a compact disc (CD), digital versatile disc (DVD), or Blu-ray Disc (BD)™), a flash memory device, a memory card, and the like.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2020-173388, filed Oct. 14, 2020, and Japanese Patent Application No. 2021-156344, filed Sep. 27, 2021, which are hereby incorporated by reference herein in their entirety.

What is claimed is:

1. A photoelectric conversion apparatus comprising:
a first substrate including an avalanche photodiode; and
a second substrate,
wherein the first substrate and the second substrate are stacked on each other,
the photoelectric conversion apparatus further comprising:
at least one temperature detection unit arranged in at least one of the first substrate and the second substrate and having an output characteristic depending on a temperature; and
a temperature value generating circuit arranged outside the first substrate and configured to convert output from the temperature detection unit into a temperature value signal that is a signal indicating temperature information.

2. The photoelectric conversion apparatus according to claim 1, wherein the temperature value generating circuit is arranged in the second substrate.

3. The photoelectric conversion apparatus according to claim 1 further comprising:
a first component including the first substrate and the second substrate; and
a second component that is electrically connected to the first component and is different from the first component,
wherein the temperature value generating circuit is arranged in the second component.

4. The photoelectric conversion apparatus according to claim 1, wherein the temperature detection unit is arranged in the first substrate.

5. The photoelectric conversion apparatus according to claim 1, wherein the temperature detection unit is arranged in the second substrate.

6. The photoelectric conversion apparatus according to claim 1, wherein the temperature detection unit is arranged in the first substrate and the second substrate.

7. The photoelectric conversion apparatus according to claim 1, wherein the avalanche photodiode and the temperature detection unit are isolated from each other in respective wells.

8. The photoelectric conversion apparatus according to claim 1 further comprising a signal processing circuit arranged in the second substrate and configured to process an output signal of the avalanche photodiode.

9. The photoelectric conversion apparatus according to claim 1, wherein the temperature value signal has temperature accuracy of 5 degrees Celsius or less.

10. The photoelectric conversion apparatus according to claim 1, wherein a plurality of temperature detection units are arranged at different positions on a plane of the first substrate or the second substrate.

11. The photoelectric conversion apparatus according to claim 1 further comprising a compensation unit that compensates a change in an output characteristic of the avalanche photodiode based on the temperature value signal.

12. The photoelectric conversion apparatus according to claim 1, wherein a plurality of temperature detection units are arranged at different positions on a plane of the first substrate or the second substrate,
the photoelectric conversion apparatus further comprising a compensation unit that compensates a change in an output characteristic of the avalanche photodiode based on a plurality of temperature value signals output from the plurality of temperature detection units.

13. The photoelectric conversion apparatus according to claim 12, wherein the compensation unit compensates a change in an output characteristic of the avalanche photodiode for each of regions corresponding to positions on a plane of the plurality of temperature detection units.

14. The photoelectric conversion apparatus according to claim 12, wherein the compensation unit compensates a change in an output characteristic of the avalanche photodiode based on a representative value of the plurality of temperature value signals.

15. The photoelectric conversion apparatus according to claim 12, wherein the compensation unit compensates a change in an output characteristic of the avalanche photodiode based on a result obtained by calculating the plurality of temperature value signals.

16. The photoelectric conversion apparatus according to claim 11, wherein the compensation unit compensates a change in an output characteristic of the avalanche photodiode by controlling a power source voltage for the avalanche photodiode.

17. The photoelectric conversion apparatus according to claim 11, wherein the compensation unit compensates a change in an output characteristic of the avalanche photodiode by correcting output of the avalanche photodiode.

18. The photoelectric conversion apparatus according to claim 1,
wherein the temperature detection unit is a diode or a ring oscillator, and
wherein the temperature value generating circuit is a counter circuit, a resistor element, an amplifier circuit, or an analog-to-digital converter circuit.

19. The photoelectric conversion apparatus according to claim 11, wherein the temperature value generating circuit generates a temperature value signal corrected in accordance with an individual value of the temperature detection unit.

20. The photoelectric conversion apparatus according to claim 19, wherein the individual value of the temperature detection unit is a characteristic value of each individual for a voltage value, a current value, or an oscillation frequency as output from the temperature detection unit.

21. The photoelectric conversion apparatus according to claim 11, wherein the compensation unit reflects an individual value of the avalanche photodiode to compensate a change in an output characteristic of the avalanche photodiode.

22. The photoelectric conversion apparatus according to claim 21, wherein the individual value of the avalanche photodiode is a breakdown voltage value of the avalanche photodiode.

23. The photoelectric conversion apparatus according to claim 16, wherein the compensation unit corrects and controls the power source voltage for the avalanche photodiode in accordance with an individual value of a breakdown voltage of the avalanche photodiode.

24. The photoelectric conversion apparatus according to claim 23, wherein the power source voltage of the avalanche photodiode is controlled by the compensation unit based on an equation expressed by:

$$V=\alpha \times \Delta T + Vi + \Delta Vbd,$$

where a power source voltage value of the avalanche photodiode is denoted as V, a change in a temperature value indicated by the temperature value signal is denoted as $\Delta T$, a compensation value per unit temperature of the power source voltage of the avalanche photodiode is denoted as $\alpha$, an ideal value of the power source voltage value at a reference temperature is denoted as Vi, and a shift of an individual value from an ideal value of the breakdown voltage is denoted as $\Delta Vbd$.

25. The photoelectric conversion apparatus according to claim 11, wherein in the compensation unit, a compensation amount per unit temperature at a temperature outside a first temperature range of the temperature value signal is different from a compensation amount per unit temperature in the first temperature range.

26. The photoelectric conversion apparatus according to claim 25, wherein the compensation amount in a second temperature range that is higher than the first temperature range is smaller than the compensation amount in the first temperature range.

27. The photoelectric conversion apparatus according to claim 25, wherein no compensation is performed in a second temperature range that is higher than the first temperature range.

28. A photo-detection system comprising:
the photoelectric conversion apparatus according to claim 1; and
a signal processing unit that processes a signal output from the photoelectric conversion apparatus.

29. A movable body comprising:
the photoelectric conversion apparatus according to claim 1;
a distance information acquisition unit that acquires, from a parallax image based on signals from the photoelectric conversion apparatus, distance information on a distance to an object; and
a control unit that controls the movable body based on the distance information.

* * * * *